United States Patent [19]
Gotou

[11] Patent Number: 5,747,854
[45] Date of Patent: May 5, 1998

[54] SEMICONDUCTOR DEVICE AND MANUFACTURING METHOD THEREOF

[75] Inventor: Hiroshi Gotou, Tokyo, Japan

[73] Assignee: NKK Corporation, Japan

[21] Appl. No.: 548,736

[22] Filed: Oct. 26, 1995

[30] Foreign Application Priority Data

| Oct. 31, 1994 | [JP] | Japan | 6-290618 |
| Nov. 30, 1994 | [JP] | Japan | 6-321639 |
| Aug. 31, 1995 | [JP] | Japan | 7-223880 |

[51] Int. Cl.⁶ ............................................. H01L 29/76
[52] U.S. Cl. ............................................. 257/368; 257/407
[58] Field of Search ............................ 257/368, 369, 257/391, 392, 401, 402, 407

[56] References Cited

U.S. PATENT DOCUMENTS

| 3,855,610 | 12/1974 | Masuda et al. | 257/407 |
| 4,395,725 | 7/1983 | Parekh | 257/391 |
| 5,231,299 | 7/1993 | Ning et al. | 257/402 |

*Primary Examiner*—Mark V. Prenty
*Attorney, Agent, or Firm*—Nixon & Vanderhye

[57] ABSTRACT

A semiconductor device includes at least two adjacent regions which have different threshold values and each of which has a discrete channel region of a first conductivity type, a common source and a common drain of a second conductivity type with the discrete channel region disposed therebetween, and a common gate formed above the discrete channel region. With this structure, the operation speed of the circuit can be maintained, a through current, particularly a through current at the time of operation can be reduced, and the power consumption can be lowered.

2 Claims, 20 Drawing Sheets

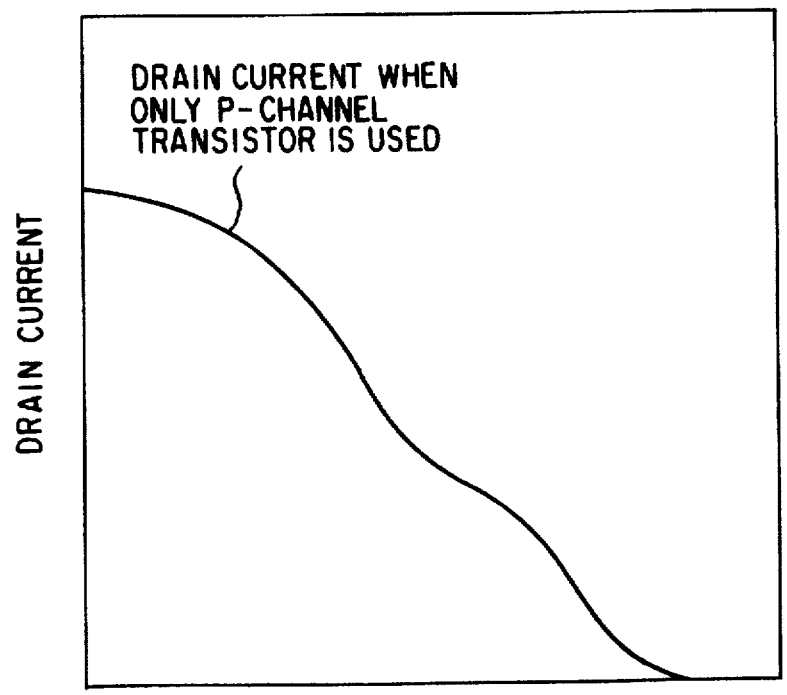
F I G. 6

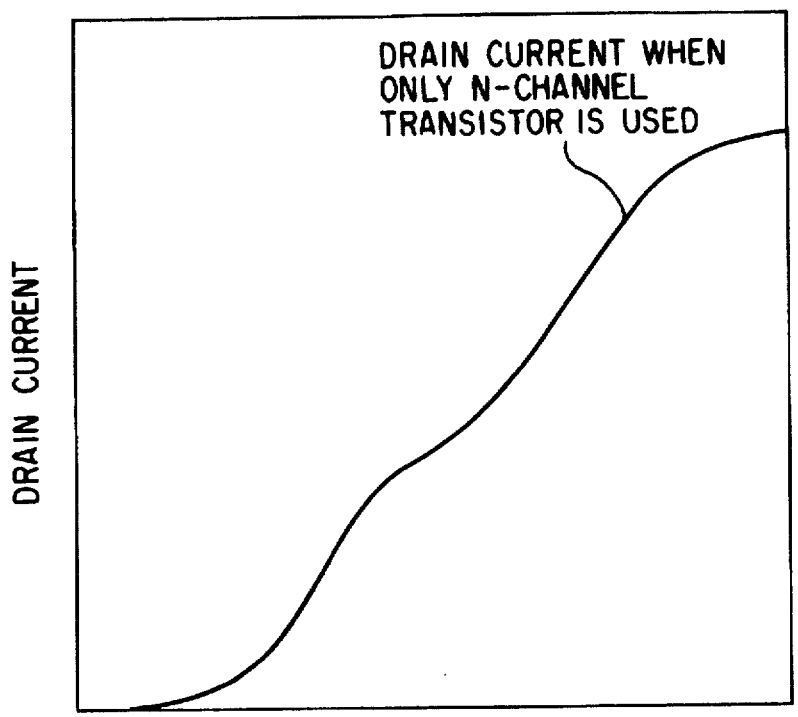
F I G. 8
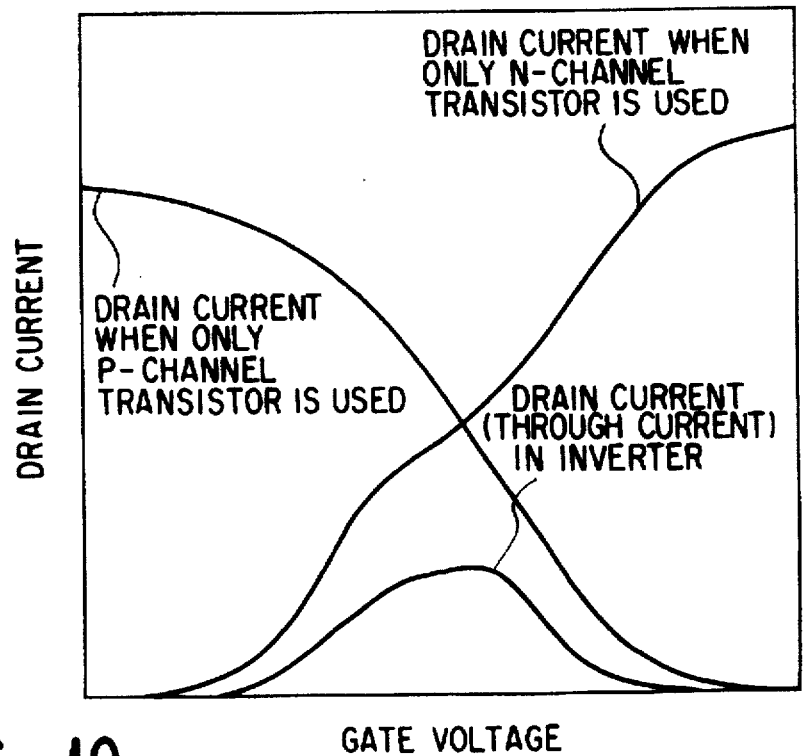
F I G. 10

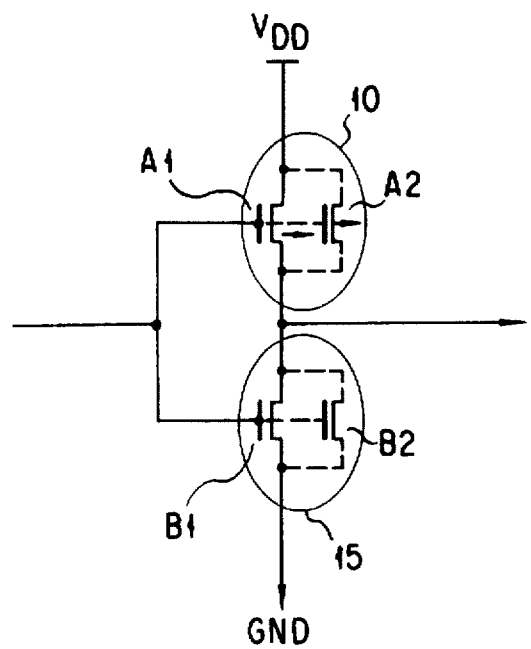
F I G. 11
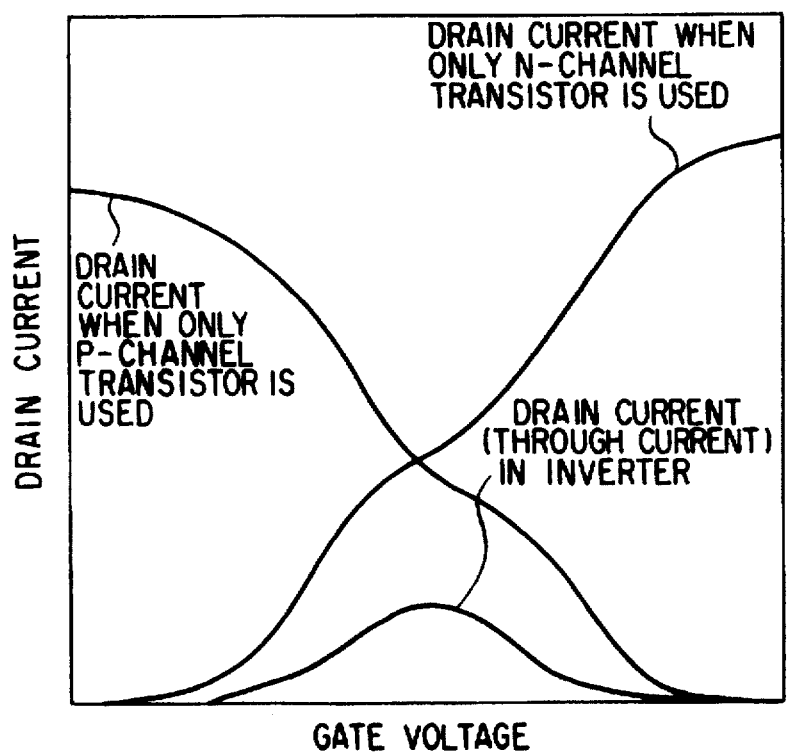
F I G. 12

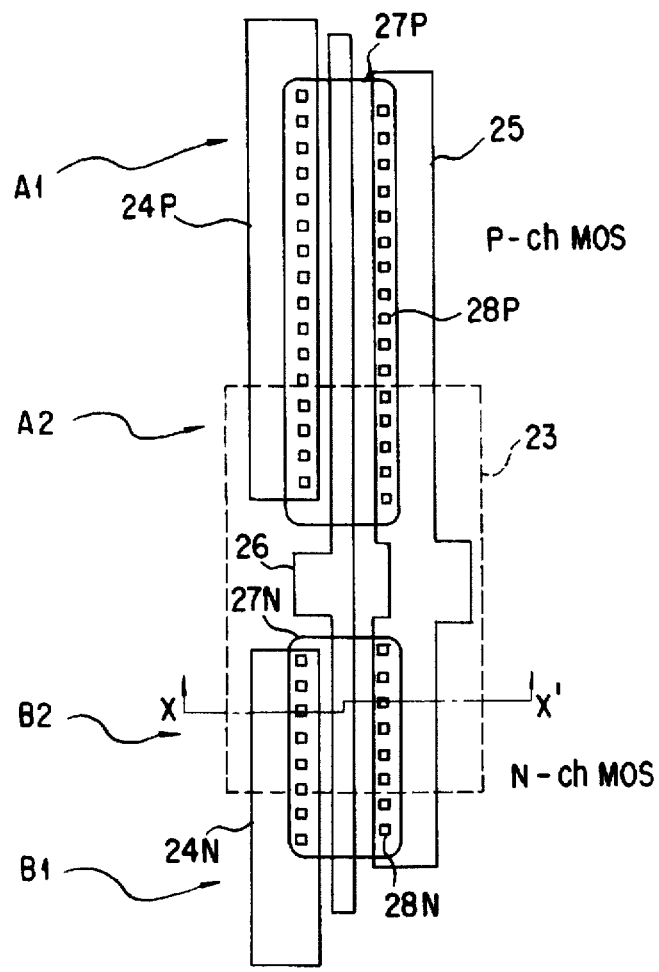
FIG. 13A
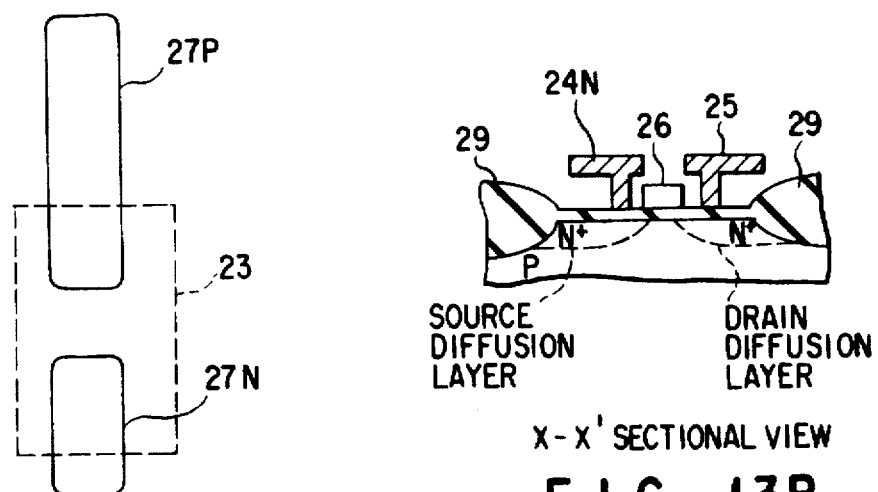
FIG. 14
FIG. 13B

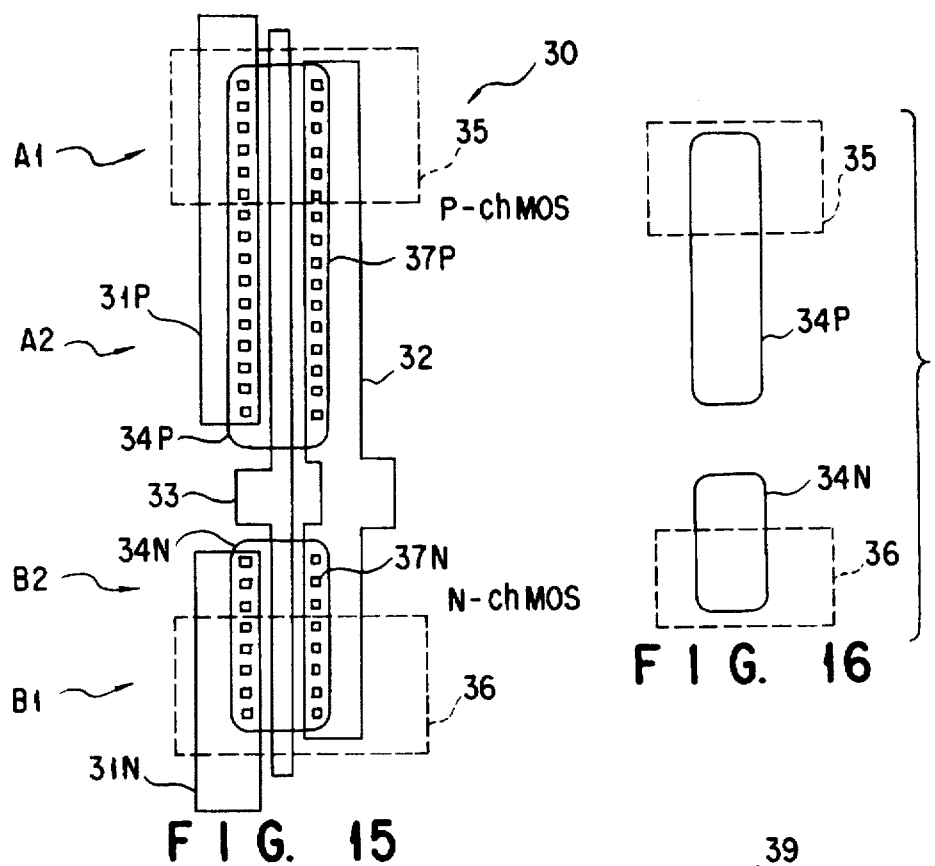
F I G. 15
F I G. 16
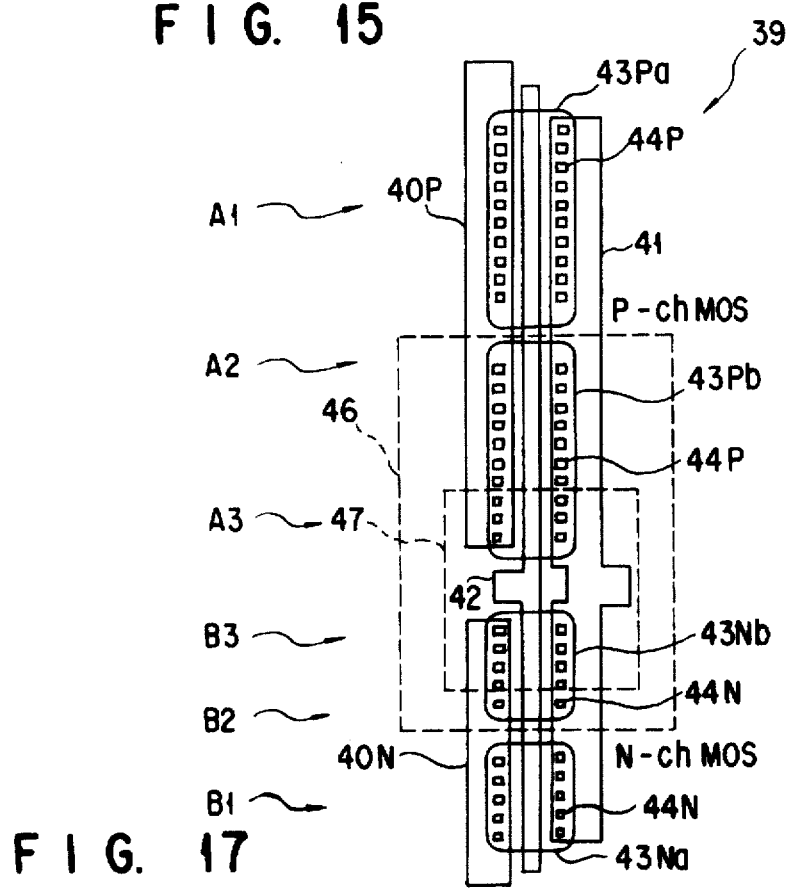
F I G. 17

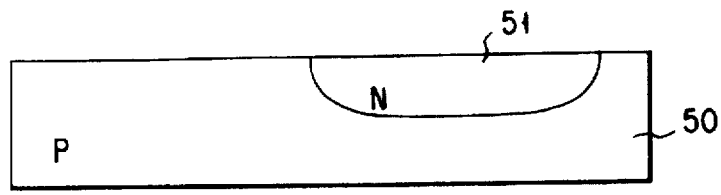
F I G. 22A
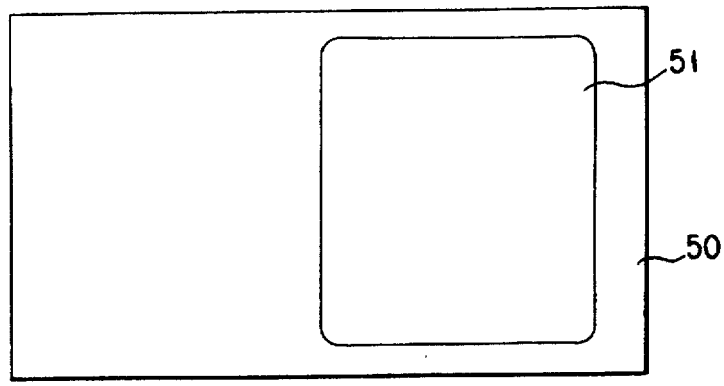
F I G. 22B
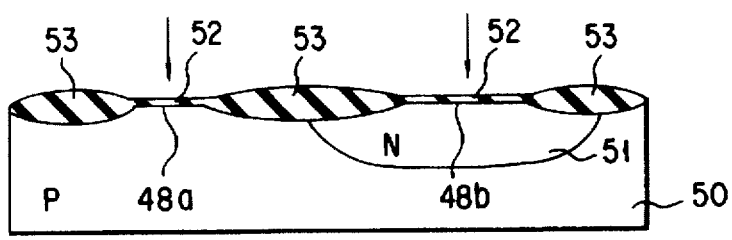
F I G. 22C
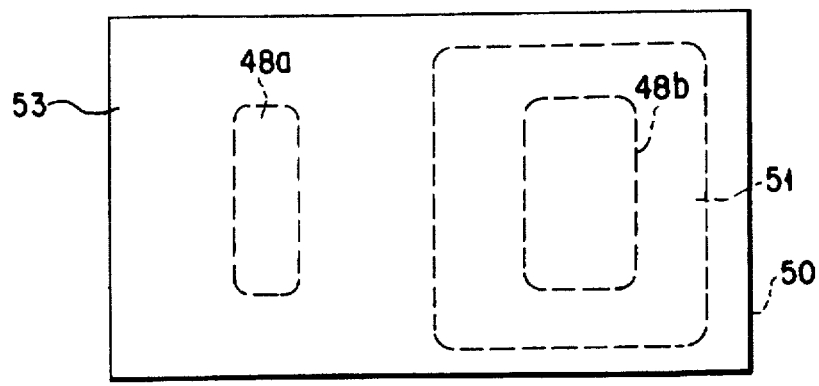
F I G. 22D

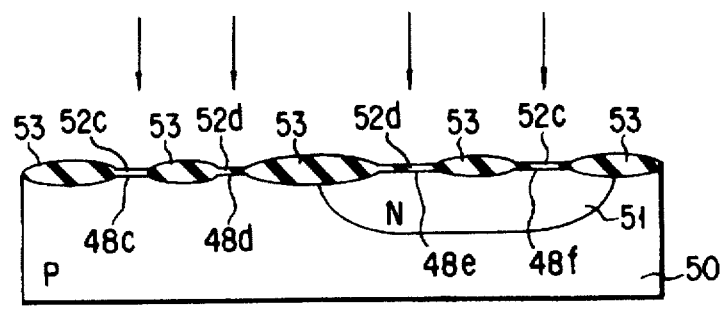
F I G. 26C
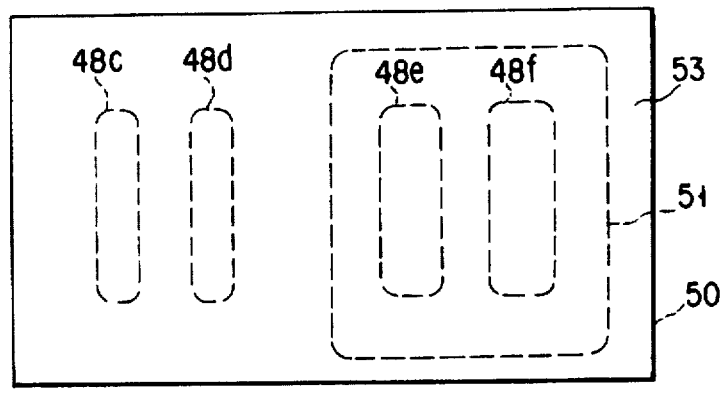
F I G. 26D
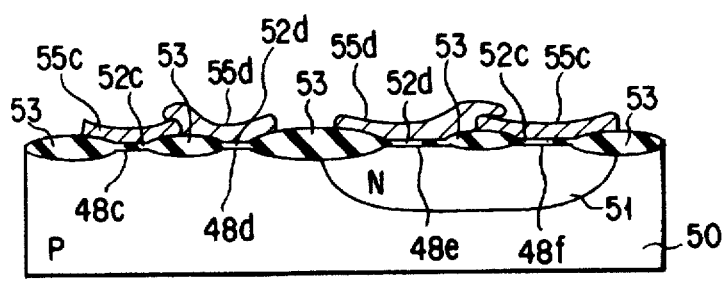
F I G. 27A
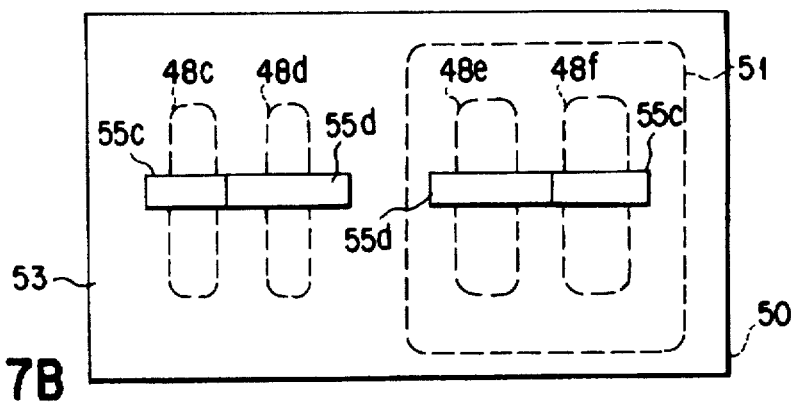
F I G. 27B

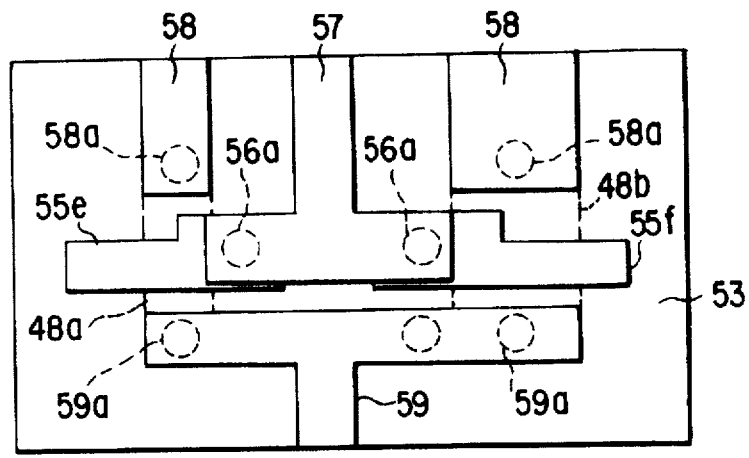
F I G. 30D
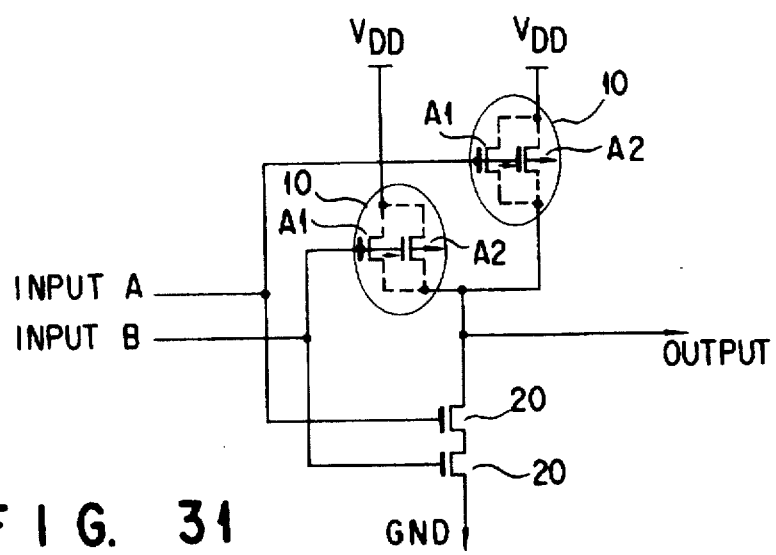
F I G. 31
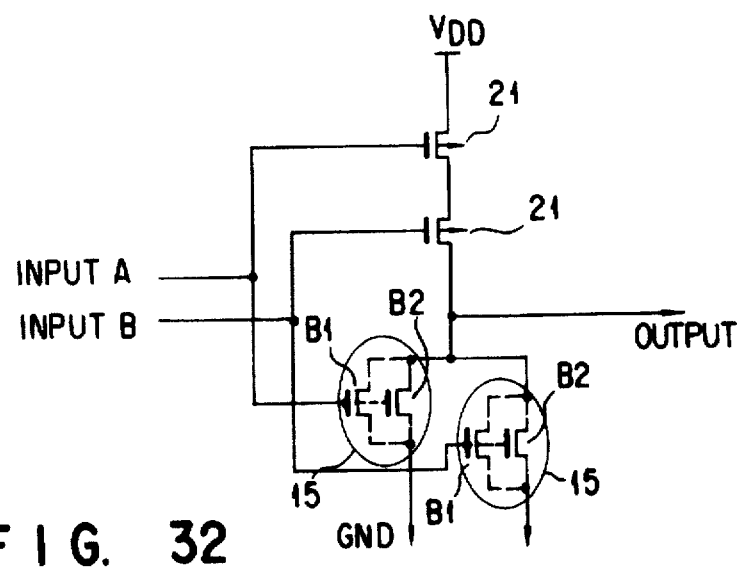
F I G. 32

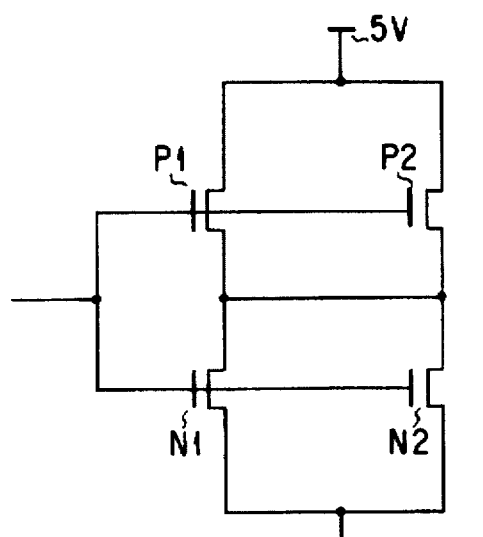
F I G. 33
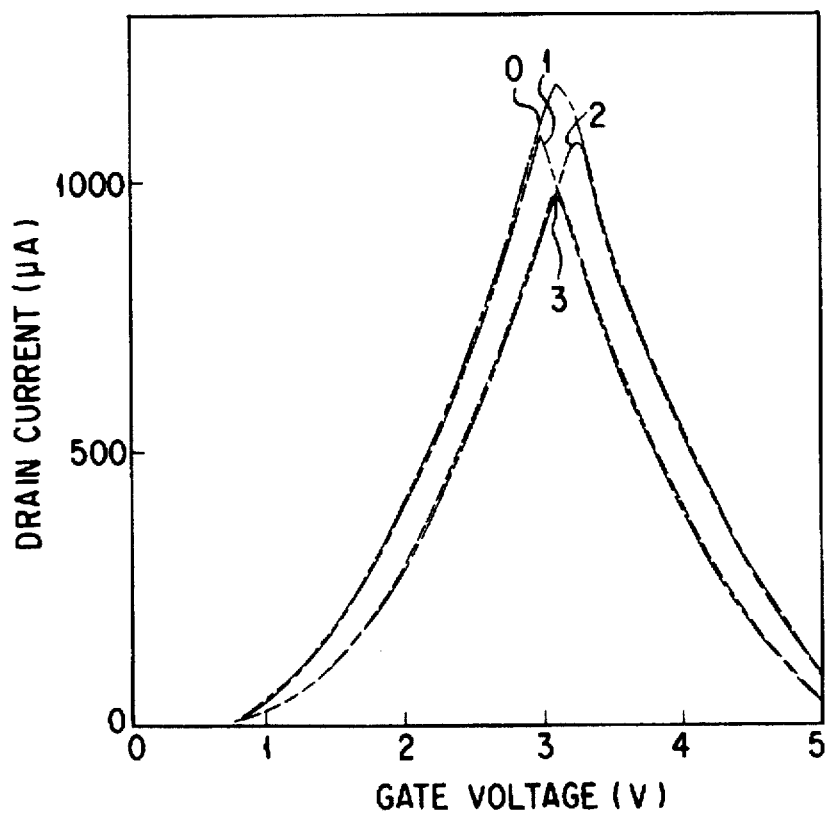
F I G. 34

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

FIG. 1 is a circuit diagram showing the construction of a conventional CMOS inverter. As shown in FIG. 1, an inverter 100 which is a typical example of the conventional CMOS circuit includes a P-type MOSFET 101 and an N-type MOSFET 102 series-connected between reference power supply terminals. The inverter 100 inverts the level of an input signal supplied thereto and outputs the inverted signal.

FIG. 2 is a characteristic diagram showing the drain current characteristic of the conventional CMOS inverter of FIG. 1. When a signal changing from the low voltage to high voltage or a signal of the inverted form thereof is input to the gates of the P-type MOSFET 101 and N-type MOSFET 102, a through current flowing from the P-type MOSFET 101 to the N-type MOSFET 102 is generated in addition to a drain current for charging or discharging the load during the change as shown in FIG. 2.

FIG. 3 is a circuit diagram showing the construction of a conventional NAND circuit. A 2-input NAND circuit 104 which is one example of the conventional NAND circuit includes parallel-connected P-type MOSFETs 105, 106 and series-connected N-type MOSFETs 107, 108.

FIG. 4 is a circuit diagram showing the construction of a conventional NOR circuit. A 2-input NOR circuit 109 which is one example of the conventional NOR circuit includes series-connected P-type MOSFETs 110, 111 and parallel-connected N-type MOSFETs 112, 113.

The above NAND circuit and NOR circuit each have the P-type MOSFETs and the N-type MOSFETs serially connected between the reference power supply terminals, and therefore, the same through current as shown in FIG. 2 is generated in the NAND circuit or NOR circuit during the operation thereof.

Since the through current does not contribute to the charging or discharging of the load, it is desired to reduce the same to minimum. Since the through current is determined by the overlapped portion of the operating regions of the P-type MOSFET and the N-type MOSFET, the through current can be reduced by making the fall of the drain current of the P-type MOSFET and the rise of the drain current of the N-type MOSFET less steep in the linear operating region of the MOS transistor in the conductive state. However, when the through current is reduced in this way, the operation of the inverter, NAND circuit and NOR circuit generally becomes slow. For this reason, if it is desired to maintain the high speed operation of the circuit, it becomes difficult to reduce the overlapped portion of the operating regions.

SUMMARY OF THE INVENTION

An object of the present invention is to provide a MOS transistor in which a plurality of regions having different threshold values can be formed and which can realize a non-linear characteristic in which at least one inflection point occurs in the rise or fall region of the operating region in the conductive state when the MOS transistor is formed on a semiconductor substrate and used at normal temperatures.

Another object of the present invention is to provide a semiconductor device and a manufacturing method thereof which can maintain the operation speed of the circuit and reduce the through current, especially the through current at the time of operation to reduce the power consumption.

According to an aspect of the present invention, there is provided a MOS transistor comprising: at least two adjacent regions, each region having a discrete channel region of a first conductivity type, a common source and a common drain of a second conductivity type formed with the discrete channel region disposed therebetween, and a common gate formed above the discrete channel region and the at least two adjacent regions having different threshold values.

According to another aspect of the present invention, there is provided a MOS transistor comprising: a semiconductor substrate of a first conductivity type; and at least two adjacent regions which are formed in the semiconductor substrate, which have different threshold values and each of which has a common source and a common drain of a second conductivity type and a common gate formed above a discrete channel region of the first conductivity type disposed between the common source and the common drain; wherein at least one inflection point is provided in the rise characteristic of the gate voltage-drain current characteristic when it is used at normal temperatures.

According to still another of the present invention, there is provided a semiconductor device comprising: an input terminal for receiving an input signal; a plurality of MOS transistors of different conductivity types series-connected between reference power supply terminals, for generating an output signal corresponding to the input signal, at least one of the MOS transistors having a plurality of regions which have different threshold values and at least one of which has a threshold value different from the threshold value of the other MOS transistor; and an output terminal for outputting the output signal.

According to still another aspect of the present invention, there is provided a semiconductor device comprising: an input terminal for receiving an input signal; a plurality of MOS transistors of different conductivity types series-connected between reference power supply terminals, at least one of the MOS transistors having a plurality of regions which have different threshold values, at least one of which has a threshold value different from the threshold value of the other MOS transistor, the threshold value of one of the plurality of regions being set higher than the threshold value of the other MOS transistor so as to reduce a through current, and the threshold value of the other region having the same threshold value as the threshold value of the other MOS transistor so as to cope with a load current and maintain the response speed; and an output terminal for outputting the output signal.

According to still another aspect of the present invention, there is provided a CMOS inverter comprising: a plurality of MOS transistors of first and second conductivity types series-connected between reference power supply terminals, for receiving an input signal at the gate of each of the MOS transistors and outputting an inverted signal from a connection node of the series connection; wherein the MOS transistor of the first conductivity type includes a discrete channel region of the first conductivity type having at least two adjacent channel regions formed to have different threshold values by partially ion-implanting impurity, a common source and a common drain of the second conductivity type formed with the discrete channel region of the first conductivity type disposed therebetween, and a common gate formed above the discrete channel region of the first conductivity type, and the MOS transistor of the second conductivity type includes a discrete channel region of the second conductivity type having at least two adjacent channel regions formed to have different threshold values by partially ion-implanting impurity, a common source and a common drain of the first conductivity type formed with the discrete channel region of the second conductivity type disposed therebetween, and a common gate formed above the discrete channel region of the second conductivity type.

According to still another aspect of the present invention, there is provided a CMOS inverter comprising: a plurality of MOS transistors of first and second conductivity types series-connected between reference power supply terminals, for receiving an input signal at the gate of each of the MOS transistors and outputting an inverted signal from a connection node of the series connection; wherein the MOS transistor of the first conductivity type includes at least two adjacent discrete channel regions of the first conductivity type, a common source and a common drain of the second conductivity type formed with the discrete channel region of the first conductivity type disposed therebetween, a gate insulation film having at least two adjacent regions having different threshold values and formed of a gate insulation material with partially different thicknesses formed on the discrete channel region of the first conductivity type, and a common gate formed on the gate insulation film, and the MOS transistor of the second conductivity type includes at least two adjacent discrete channel regions of the second conductivity type, a common source and a common drain of the first conductivity type formed with the discrete channel region of the second conductivity type disposed therebetween, a gate insulation film having at least two adjacent regions having different threshold values and formed of a gate insulation material with partially different thicknesses formed on the discrete channel region of the second conductivity type, and a common gate formed on the gate insulation film.

According to still another aspect of the present invention, there is provided a CMOS inverter comprising: a plurality of MOS transistors of first and second conductivity types series-connected between reference power supply terminals, for receiving an input signal at the gate of each of the MOS transistors and outputting an inverted signal from a connection node of the series connection; wherein the MOS transistor of the first conductivity type includes at least two adjacent discrete channel regions of the first conductivity type, a common source and a common drain of the second conductivity type formed with the discrete channel region of the first conductivity type disposed therebetween, and a common gate formed above the discrete channel region of the first conductivity type and having at least two adjacent regions formed to have different threshold values by use of a gate electrode material formed of partially different materials, and the MOS transistor of the second conductivity type includes at least two adjacent discrete channel regions of the second conductivity type, a common source and a common drain of the first conductivity type formed with the discrete channel region of the second conductivity type disposed therebetween, and a common gate formed above the discrete channel region of the second conductivity type and having at least two adjacent regions formed to have different threshold values by use of a gate electrode material formed of partially different materials.

According to still another aspect of the present invention, there is provided a CMOS inverter comprising: a plurality of MOS transistors of first and second conductivity types series-connected between reference power supply terminals, for receiving an input signal at the gate of each of the MOS transistors and outputting an inverted signal from a connection node of the series connection, wherein the MOS transistor of the first conductivity type includes a discrete channel region of the first conductivity type having at least two adjacent regions formed to have different threshold values by making the channel lengths thereof partially different, a common source and a common drain of the second conductivity type formed with the discrete channel region of the first conductivity type disposed therebetween, and a common gate formed above the discrete channel region of the first conductivity type, and the MOS transistor of the second conductivity type includes a discrete channel region of the second conductivity type having at least two adjacent regions formed to have different threshold values by making the channel lengths thereof partially different, a common source and a common drain of the first conductivity type formed with the discrete channel region of the second conductivity type disposed therebetween, and a common gate formed above the discrete channel region of the second conductivity type.

According to still another aspect of the present invention, there is provided a NAND circuit comprising: a plurality of parallel-connected MOS transistors of a first conductivity type corresponding in number to inputs; and a plurality of series-connected MOS transistors of a second conductivity type corresponding in number to inputs; the MOS transistors of the first and second conductivity types being series-connected between reference power supply terminals, input signals being supplied to the gates of the MOS transistors and a NAND signal of the input signals being output from a connection node between the MOS transistors of the first conductivity type and the MOS transistors of the second conductivity type, wherein the MOS transistor of one conductivity type includes at least two adjacent regions each of which includes at least two adjacent discrete channel regions of the one conductivity type, a common source and a common drain of the other conductivity type formed with the discrete channel region disposed therebetween, and a common gate formed above the discrete channel region, and the at least two adjacent regions are formed to have different threshold values.

According to still another aspect of the present invention, there is provided a NOR circuit comprising: a plurality of series-connected MOS transistors of a first conductivity type corresponding in number to inputs; and a plurality of parallel-connected MOS transistors of a second conductivity type corresponding in number to inputs; the MOS transistors of the first and second conductivity types being series-connected between reference power supply terminals, input signals being supplied to the gates of the MOS transistors, and a NOR signal of the input signals being output from a connection node between the MOS transistors of the first conductivity type and the MOS transistors of the second conductivity type, wherein the MOS transistor of one conductivity type includes at least two adjacent regions each of which includes at least two adjacent discrete channel regions of the one conductivity type, a common source and a common drain of the other conductivity type formed with the discrete channel region disposed therebetween, and a common gate formed above the discrete channel region, and the at least two adjacent regions are formed to have different threshold values.

According to still another aspect of the present invention, there is provided a NOT circuit comprising: a plurality of MOS transistors of first and second conductivity types series-connected between reference power supply terminals; an input signal being supplied to the gates of the MOS transistors and a NOT signal of the input signal being output from a connection node of the series connection, wherein the MOS transistor of the first conductivity type includes at least two adjacent regions each of which includes at least two adjacent discrete channel regions of the first conductivity type, a common source and a common drain of the second conductivity type formed with the discrete channel region disposed therebetween, and a common gate formed above the discrete channel region, and the at least two adjacent regions are formed to have different threshold values, and the MOS transistor of the second conductivity type includes at least two adjacent regions each of which includes at least two adjacent discrete channel regions of the second conductivity type, a common source and a common drain of the first conductivity type formed with the discrete channel region disposed therebetween, and a common gate formed above the discrete channel region, and the at least two adjacent regions are formed to have different threshold values.

According to still another aspect of the present invention, there is provided a semiconductor device manufacturing method comprising the steps of: forming a well of a second conductivity type on a semiconductor substrate of a first conductivity type; forming an element forming regions in the semiconductor substrate of the first conductivity type and the well of the second conductivity type; forming a gate insulation film with a preset film thickness on the element forming regions of the first and second conductivity types; effecting a first threshold value adjusting ion-implantation process in the element forming regions of the first and second conductivity types; partly masking and partly exposing the element forming regions of the first and second conductivity types, and effecting a second threshold value adjusting ion-implantation process; forming gate electrodes by use of polycrystalline silicon; and effecting an ion-implantation process in a self-alignment manner with the gate electrodes used as a mask to form source and drain regions.

According to still another aspect of the present invention, there is provided a semiconductor device manufacturing method comprising the steps of: forming a well of a second conductivity type on a semiconductor substrate of a first conductivity type; forming an element forming regions in the semiconductor substrate of the first conductivity type and the well of the second conductivity type; forming a first gate insulation film with a preset film thickness on the element forming regions of the first and second conductivity types; effecting a threshold value adjusting ion-implantation process in the element forming regions of the first and second conductivity types; removing part of the first gate insulation film and forming a second gate insulation film with a different film thickness in the removed portion; forming gate electrodes by use of polycrystalline silicon; and effecting an ion-implantation process in a self-alignment manner with the gate electrodes used as a mask to form source and drain regions.

According to still another aspect of the present invention, there is provided a semiconductor device manufacturing method comprising the steps of: forming a well of a second conductivity type on a semiconductor substrate of a first conductivity type; forming an element forming regions in the semiconductor substrate of the first conductivity type and the well of the second conductivity type; forming a gate insulation film with a preset film thickness on the element forming regions of the first and second conductivity types; effecting a threshold value adjusting ion-implantation process in the element forming regions of the first and second conductivity types; forming first gate electrodes with a first preset thickness formed of a first material and second gate electrodes with a second preset thickness formed of a second material in the element forming regions of the first and second conductivity types; and effecting an ion-implantation process in a self-alignment manner with the first and second gate electrodes used as a mask to form source and drain regions.

According to still another aspect of the present invention, there is provided a semiconductor device manufacturing method comprising the steps of: forming a well of a second conductivity type on a semiconductor substrate of a first conductivity type; forming an element forming regions in the semiconductor substrate of the first conductivity type and the well of the second conductivity type; forming a gate insulation film with a preset film thickness on the element forming regions of the first and second conductivity types; effecting a threshold value adjusting ion-implantation process in the element forming regions of the first and second conductivity types; forming gate electrodes in the element forming regions of the first and second conductivity types such that the gate length becomes different from the gate length of the other portion over a preset length of the channel width; and effecting the ion-implantation process in a self-alignment manner with the gate electrodes used as a mask to form source and drain regions.

According to the present invention, in the case of ion-implantation into the channel, in a combination of a desired P-channel MOS transistor and a desired N-channel MOS transistor, MOS transistors having different through currents between at least two different combinations can be used, the impurity diffusion processes can be effected in the same diffusion step, the impurity diffusion processes can be effected in different diffusion steps, and the impurity diffusion processes can be effected in the double diffusion step. Further, P-channel MOS transistors having different threshold values or N-channel MOS transistors having different threshold values can be formed by changing the condition of impurity diffusion, and it is possible to set the gate insulation films of at least one pair of P-channel MOS transistors having different threshold values adjacent to each other or set the gate insulation films of at least one pair of the N-channel MOS transistors having different threshold values adjacent to each other.

Further, when the gate insulation film is changed, it is possible to form regions in which the thickness of the gate insulation film of the P-channel MOS transistor or N-channel MOS transistor is different in the same transistor, and it is possible to set the gate insulation films of at least one pair of P-channel MOS transistors having different threshold values, which are adjacent to each other via an insulation film thicker than the gate insulation film or set the gate insulation films of at least one pair of N-channel MOS transistors having different threshold values, which are adjacent to each other via an insulation film thicker than the gate insulation film.

The MOS transistor of the present invention includes at least two adjacent regions having different threshold values and has at least one inflection point in the rise or fall characteristic of the gate voltage-drain current characteristic when used at normal temperatures. In the present invention, each of the CMOS inverter, NAND circuit and NOR circuit can be constructed by incorporating a MOS transistor of the present invention into at least one of the P-type MOSFET and N-type MOSFET series-connected between the reference power supply terminals.

As a result, the power consumption can be lowered without much sacrifice of the operation speed of the circuit. Especially, the through current in the CMOS inverter, NAND circuit and NOR circuit in operation can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a drain current characteristic diagram of the MOS transistor (P-channel MOS transistor) shown in FIG. 5A;

FIG. 8 is a drain current characteristic diagram of the MOS transistor (N-channel MOS transistor) shown in FIG. 7A;

FIG. 10 is a drain current characteristic diagram of the CMOS inverter of the second embodiment shown in FIG. 9A;

FIG. 11 is a circuit diagram showing the basic construction of a CMOS inverter according to a third embodiment of the present invention, and MOS transistors of the present invention are used for P- and N-channel transistors;

FIG. 12 is a drain current characteristic diagram of the CMOS inverter of the third embodiment shown in FIG. 11;

FIG. 13A is a plan view showing the structure of a CMOS inverter according to a fourth embodiment of the present invention;

FIG. 13B is a cross sectional view taken along the line X—X of FIG. 13A;

FIG. 14 is a view showing the arrangement of a mask used for ion-implantation in the fourth embodiment;

FIG. 15 is a plan view showing the structure of a CMOS inverter according to a fifth embodiment of the present invention;

FIG. 16 is a view showing the arrangement of a mask used for ion-implantation in the fifth embodiment;

FIG. 17 is a plan view showing the structure of a CMOS inverter according to a sixth embodiment of the present invention;

FIGS. 22A to 22D are cross sectional views for illustrating the manufacturing method of a CMOS inverter according to a ninth embodiment of the present invention;

FIGS. 26A to 26D are cross sectional views for illustrating the manufacturing method of a CMOS inverter according to an eleventh embodiment of the present invention;

FIGS. 27A to 27D are cross sectional views for illustrating the manufacturing method of the CMOS inverter according to the eleventh embodiment of the present invention;

FIGS. 30A to 30D are cross sectional views for illustrating the manufacturing method of the CMOS inverter according to the thirteenth embodiment of the present invention;

FIG. 31 is a circuit diagram showing the construction of a NAND circuit according to a fourteenth embodiment of the present invention;

FIG. 32 is a circuit diagram showing the construction of a NOR circuit according to a fifteenth embodiment of the present invention;

FIG. 33 is a circuit diagram showing a CMOS inverter used in a SPICE simulation; and FIG. 34 is a graph showing the result of the SPICE simulation.

DETAILED DESCRIPTION OF THE PREFERRED EMBODIMENTS

There will now be described an embodiment of the present invention with reference to the accompanying drawings.

9

(Embodiment 1)

Figure 5A:
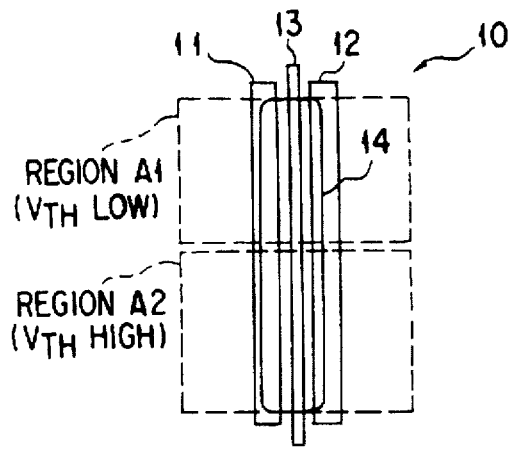
FIG. 5A is a schematic view showing a MOS transistor (P-channel MOS transistor) according to a first embodiment of the present invention.
Figure 5B:
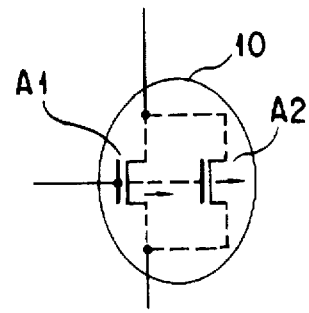
FIG. 5B is a circuit diagram showing an equivalent circuit of the MOS transistor of FIG. 5A.

FIG. 5A is a plan view showing the basic structure of a P-channel MOS transistor according to a first embodiment of the present invention. FIG. 5B is a circuit diagram showing an equivalent circuit of the MOS transistor of FIG. 5A. The P-channel MOS transistor of the present invention comprises at least two adjacent regions formed on a semiconductor substrate (not shown) and having different threshold values. The P-channel MOS transistor 10 of the present invention shown in FIG. 5A is constructed by a first region A1 having a low threshold value VTH and a second region A2 having a high threshold value VTH formed adjacent to the first region.

Reference numerals 11, 12 denote common lead-out electrodes, 13 denotes a common gate, and 14 denotes an N-type impurity diffused region used as a common source/drain region.

The equivalent circuit of the P-channel MOS transistor 10 is formed of a parallel circuit of a P-channel MOS transistor formed in the first region A1 and a P-channel MOS transistor formed in the second region A2 as shown in FIG. 5B.

A specific method of setting the threshold values of the MOS transistors to different values is described later, but as the parameters for determining the threshold values, there are (1) gate oxide film thickness, (2) gate material, (3) charges in the gate oxide film, (4) channel impurity concentration, (5) channel length (region in which the short channel effect occurs), and (6) substrate potential.

FIG. 6 is a drain current characteristic diagram of the P-channel MOS transistor shown in FIG. 5A. The P-channel MOS transistor formed in the first region A1 and the P-channel MOS transistor formed in the second region A2 have different fall characteristics owing to the difference in the threshold value in the linear region of the operating region. Therefore, as shown in FIG. 6, the rise characteristic of the P-channel MOS transistor 10 becomes a non-linear characteristic to cause at least one inflection point. That is, the drain current can be set to be rapidly reduced on part of the way in the fall operation and then gradually reduced. If three or more regions having different threshold values are formed, it is possible to cause two or more inflection points in the fall characteristic. However, the P-channel MOS transistor 10 can be designed such that the total sum of drain currents caused by all of the regions can be made equal to the drain current in the normal P-channel MOS transistor in the saturation region of the operating region.

Figure 7A:
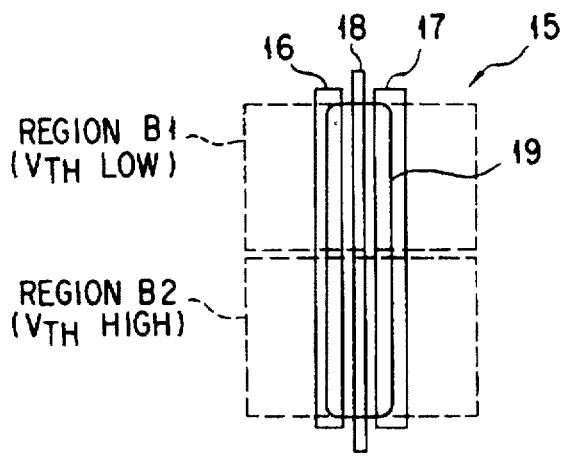
FIG. 7A is a schematic view showing a MOS transistor (N-channel MOS transistor) according to a first embodiment of the present invention.
Figure 7B:
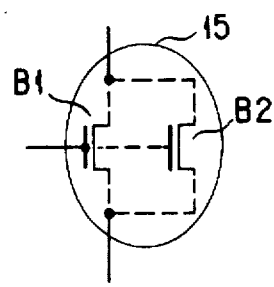
FIG. 7B is a circuit diagram showing an equivalent circuit of the MOS transistor of FIG. 7A.

FIG. 7A is a plan view showing the basic structure of an N-channel MOS transistor according to a first embodiment of the present invention, and FIG. 7B is a circuit diagram showing an equivalent circuit of the MOS transistor of FIG. 7A. The N-channel MOS transistor of the present invention is formed of at least two adjacent regions formed in the semiconductor substrate and having different threshold values. In FIG. 7A, the N-channel MOS transistor 15 of the present invention is formed of a first region B1 having a low threshold value VTH and a second region B2 having a high threshold value VTH. Reference numerals 16, 17 denote common lead-out electrodes, 18 denotes a common gate, and 19 denotes a P-type impurity diffused region used as a source/drain region. As shown in FIG. 7B, the equivalent circuit of the N-channel MOS transistor 15 is obtained by a parallel circuit of an N-channel MOS transistor formed in the first region B1 and an N-channel MOS transistor formed in the second region B2.

FIG. 8 is a drain current characteristic diagram of the N-channel MOS transistor shown in FIG. 7A. The rise characteristics of the N-channel MOS transistor formed in the first region B1 and the N-channel MOS transistor formed in the second region B2 are made different from each other in the linear region of the operating region, because the threshold values of the transistor are different. Therefore, the rise characteristic of the N-channel MOS transistor 15 becomes a non-linear characteristic to cause at least one inflection point as shown in FIG. 8. That is, the drain current can be set to gradually increase on part of the way in the rise operation and then rapidly decrease. However, the N-channel MOS transistor 15 can be designed to produce the same drain current as the drain current of the ordinary N-channel MOS transistor in the saturation region of the operating region.

According to the first embodiment, when the MOS transistor formed on the semiconductor substrate is used solely at normal temperatures, a non-linear characteristic having at least one inflection point caused in the rise or fall region of the operating region in the conductive state can be realized.

(Embodiment 2)

Figure 9A:
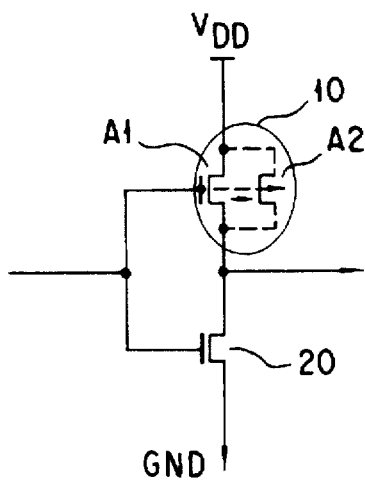
FIGS. 9A and 9B are circuit diagrams showing the basic construction of a CMOS inverter according to a second embodiment of the present invention, a MOS transistor of the present invention is used for a P-channel transistor in FIG. 9A, and a MOS transistor of the present invention is used for an N-channel transistor in FIG. 9B.
Figure 9B:
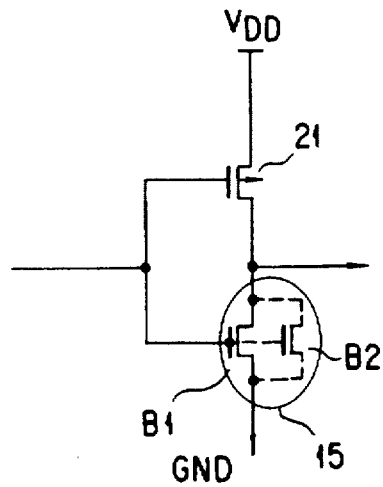

FIGS. 9A and 9B are circuit diagrams showing the basic construction of a CMOS inverter according to a second embodiment of the present invention. In the present invention, the parallel connection region of the MOS transistors in the CMOS inverter is not necessarily provided in both of the P-channel transistor section and the N-channel MOS transistor section: the through current can be made smaller than in the conventional CMOS inverter by one of the transistor sections in which the transistors having different threshold values are connected in parallel.

In the CMOS inverter of FIG. 9A, the P-channel MOS transistor 10 of the present invention is used in the P-channel transistor section, and in the CMOS inverter of FIG. 9B, the N-channel MOS transistor 15 of the present invention is used in the N-channel transistor section. That is, in the second embodiment of the present invention, an inverter having an overlapped portion of the operating regions of the P-type MOSFET and the N-type MOSFET and an inverter having no such overlapped portion are connected in parallel and combined to form a single inverter.

FIG. 10 is a characteristic diagram showing the drain current characteristic of the CMOS inverter of the second embodiment shown in FIG. 9B. In an overlapped portion of the operating regions of the P-type MOSFET and the N-type MOSFET in which a through current flows, so that the drain current of the N-channel MOS transistor 15 gradually increases on part of the way in the rise operation, the drain current (through current) of the CMOS inverter is reduced.

According to the second embodiment, it is possible to cope with the load current, maintain the response speed and reduce the through current. Further, since the embodiment has a small number of adjacent regions of different threshold values, it can be easily controlled in the manufacturing process.

(Embodiment 3)

FIG. 11 is a circuit diagram showing the basic construction of a CMOS inverter according to a third embodiment of the present invention. In the CMOS inverter, both of a P-channel transistor section and an N-channel transistor section are comprise a plurality of parallel connection regions of the present invention, which have different threshold values. In this case, in a combination of an optional P-channel transistor and an optional N-channel transistor, MOS transistors having different through currents between at least two different combinations are used. At least one of a plurality of MOS transistors of different conductivity types mprises a plurality of regions having different threshold
lues, at least one of the regions has a threshold value
ferent from the threshold value of the other MOS
nsistor, the threshold value of one of the plurality of
gions is set higher than the threshold value of the other
OS transistor so as to reduce the through current, and the
eshold value of the other region is set to have the same
eshold value of the other MOS transistor so as to cope
th the load current and maintain the response speed.

In the third embodiment, resultantly, the CMOS inverter
rtion of the transistor regions A1 and B1 contributes to the
ough current and the operation speed thereof becomes
gher than that of the CMOS inverter simply comprising
e transistor regions A1 and B1.

Figure 2:
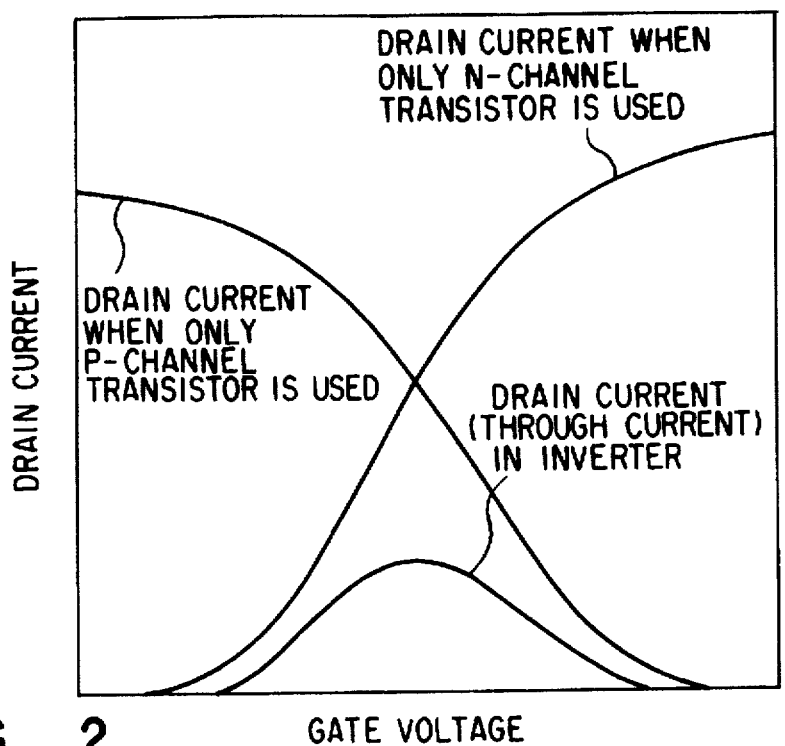
FIG. 2 is a characteristic diagram showing the drain current characteristic of the conventional CMOS inverter.

FIG. 12 is a characteristic diagram showing the drain
rrent characteristic of the CMOS inverter of the third
bodiment shown in FIG. 11. Since the drain current
aracteristic is improved by both of the P-channel MOS
nsistor section and the N-channel MOS transistor section,
 shown in FIG. 8, the through current is significantly
duced in comparison with the conventional through cur-
nt shown in FIG. 2.

According to the third embodiment, it is possible to cope
th the load current, maintain the response speed and
rther reduce the through current without fail.

Note that, it is well known that a NOT circuit for
tputting an output signal (for example, signal /x) obtained
 subjecting an input signal (for example, signal x) to the
gical NOT process can be constructed by an inverter
rcuit.

(Embodiment 4)

FIG. 13A is a plan view showing the structure of a CMOS
verter according to a fourth embodiment of the present
vention, and FIG. 13B is a cross sectional view taken
ong the line X–X' of FIG. 13A. FIG. 14 is a view showing
mask used for ion-implantation in the fourth embodiment.
e CMOS inverter 22 of the fourth embodiment is an
ample in which regions of different threshold values are
rmed by ion-implantation into the channel and the ion-
plantation is effected simultaneously for both of the
channel MOS transistor and the N-channel MOS transistor
 use of the same mask.

Regions A2 and B2 having different threshold values are
rmed in the P-channel MOS transistor and N-channel
OS transistor regions by ion-implanting boron ions B'
to an ion-implanting region 23 indicated by broken lines in
IG. 14. The impurity diffusion can be effected in the same
ffusion step.

In FIGS. 13A and 13B, reference numerals 24P, 24N, 25
note common lead-out electrodes formed of A1 or the like,
5 a common gate electrode of the P- and N-channel MOS
ansistors, 27P an N-type impurity diffused layer used as a
mmon source/drain region of the P-channel MOS
ansistors, 27N a P-type impurity diffused layer used as a
mmon source/drain region of the N-channel MOS
ansistors, and 28P, 28N contacts for connecting the impu-
ty diffused layers to the lead-out electrodes.

In the fourth embodiment, the regions A1 and A2 having
ifferent threshold values are adjacent to each other in the
-channel MOS transistor and the regions B1 and B2 having
ifferent threshold values are adjacent to each other in the
-channel MOS transistor. The impurity concentration of
e N' diffusion layer of the source/drain is made high.

As described before, the structure is electrically equiva-
nt to that in which MOS transistors having different
threshold values are connected in parallel. Only in at least
one of the P- and N-channel MOS transistors is required to
have the regions having different threshold values in the
MOS transistor.

According to the fourth embodiment, the through current
can be reduced in comparison with that in the conventional
CMOS inverter. For example, the power consumption could
be lowered to half by forming 1/3 of the P- and N-channel
MOS transistors as the regions A2 and B2 having the same
threshold value as in the conventional case and the rest or 2/3
of the P- and N-channel MOS transistors as regions A1 and
B1 having the threshold value twice as large as in the
conventional case.

According to the fourth embodiment, since the impurity
diffusion is effected in one diffusion step, the cost can be
lowered in comparison with a case wherein it is effected in
different diffusion steps.

(Embodiment 5)

FIG. 15 is a plan view showing the structure of a CMOS
inverter according to a fifth embodiment of the present
invention, and FIG. 16 is a view showing a mask used for
ion-implantation in the fifth embodiment. The CMOS
inverter 30 of the fifth embodiment is an example in which
regions of different threshold values are formed by ion-
implantation into the channel and the ion-implantation is
effected by use of different masks. Unlike the fourth
embodiment, ion-implanting regions 35, 36 indicated by
broken lines in FIG. 16 are separately formed. Like the
fourth embodiment, regions having different threshold val-
ues are formed in the P- and N-channel MOS transistors. For
example, by ion-implantation of boron ions B', a region A1
having a threshold value different from that of a region A2
is formed in the P-channel MOS transistor region and a
region B1 having a threshold value different from that of a
region B2 is formed in the N-channel MOS transistor region.

In FIG. 15, reference numerals 31P, 31N, 32 denote
common lead-out electrodes formed of A1 or the like, 32 a
common gate electrode of the P- and N-channel MOS
transistors, 34P an N-type impurity diffused layer used as a
common source/drain region of the P-channel MOS
transistors, 34N a P-type impurity diffused layer used as a
common source/drain region of the N-channel MOS
transistors, and 37P, 37N contacts for connecting the impu-
rity diffused layers to the lead-out electrodes.

By effecting the impurity diffusion in different steps for
both types of MOS transistors, the threshold values of the
respective MOS transistors can be independently set to
optimum values.

According to the fifth embodiment, since the impurity
diffusion can be effected in different diffusion steps, control
of the impurity concentration, that is, adjustment of the
threshold value VTH can be effected independently and
therefore easily.

(Embodiment 6)

FIG. 17 is a plan view showing the structure of a CMOS
inverter according to a sixth embodiment of the present
invention. The CMOS inverter 39 of the sixth embodiment
is an example in which regions of different threshold values
are formed by ion-implantation into the channel and diffused
layers used as source/drain regions are separately formed in
the P- and N-channel MOS transistors for respective
regions. That is, N-type impurity diffused layers 43Pa, 43Pb
are separately formed in the P-channel MOS transistor, and
P-type impurity diffused layers 43Na, 43Nb are separately
formed in the N-channel MOS transistor.

In FIG. 17, reference numerals 40P, 40N, 41 denote
common lead-out electrodes formed of A1 or the like, 42, a common gate electrode of the P- and N-channel MOS transistors, and 44P, 44N, contacts for connecting the impurity diffused layers to the lead-out electrodes.

Ion-implantation for adjusting the threshold value may be effected to cover the whole portion of one of the MOS transistor regions as shown by an ion-implanting region 46 in FIG. 17 or may be effected to partially cover one of the MOS transistor regions as shown by an ion-implanting region 47 in FIG. 17. In this case, if the ion-implantation is effected for the ion-implanting region 47, regions A1, A2, A3 having different threshold values are formed in the P-channel MOS transistor and regions B1, B2, B3 having different threshold values are formed in the N-channel MOS transistor.

According to the sixth embodiment, since the impurity concentrations of the impurity diffused layers can be separately adjusted, the thickness of the gate oxide film can be easily controlled and the cost can be lowered.

(Embodiment 7)

FIGS. 18A to 18D, 19A and 19B, and 20A to 20D are cross sectional views for illustrating the manufacturing method of a CMOS inverter according to a seventh embodiment of the present invention. The manufacturing method of the seventh embodiment is to effect the ion-implantation into the channel regions of respective MOS transistors so as to make the threshold values of the regions of the CMOS inverter different.

Figure 18A:
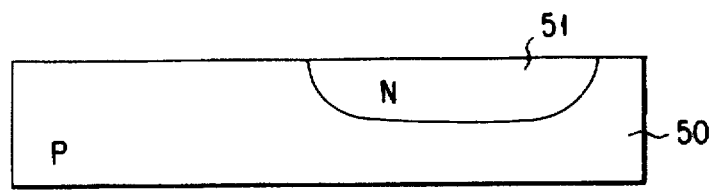
FIGS. 18A to 18D are cross sectional views for illustrating the manufacturing method of a CMOS inverter according to a seventh embodiment of the present invention.
Figure 18B:
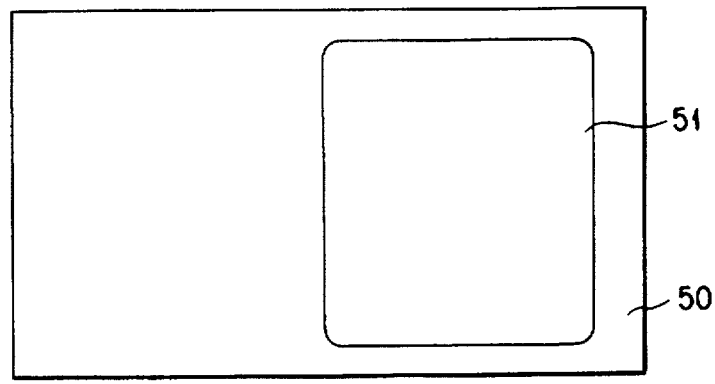
Figure 18C:
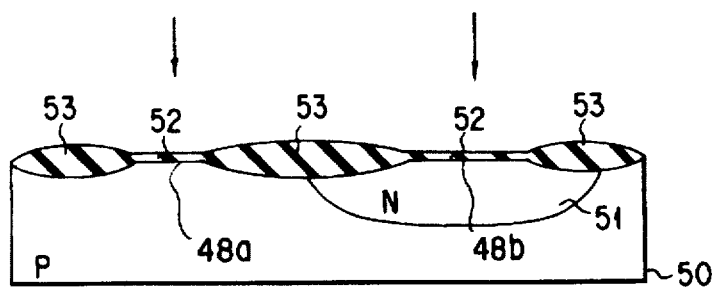
Figure 18D:
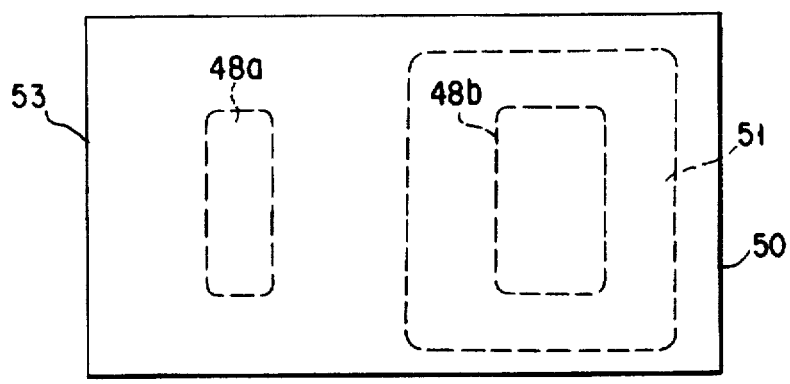

First, as shown by the cross sectional view of FIG. 18A and the plan view of FIG. 18B, after a P-type semiconductor substrate 50 is initially oxidized, an N-type well 51 is formed to the depth of 3 µm in the P-type semiconductor substrate 50. Next, as shown by the cross sectional view of FIG. 18C and the plan view of FIG. 18D, a field oxide film 53 with a film thickness of 0.7 µm is formed as an element isolation region by the ordinary LOCOS for element isolation. Next, a gate oxide film 52 with a film thickness of 10 to 20 nm is formed. Then, in order to adjust the threshold value, the first ion-implantation into channel regions 48a, 48b via the gate oxide film 52 is effected. For example, boron B⁺ ions are implanted into the channel regions 48a, 48b of the P- and N-channel MOS transistors. As a result, the first threshold values of the P- and N-channel MOS transistors are adjusted. Further, the ion-implantation for preventing the punch through is effected. For example, boron B⁺ ions are implanted into the N-channel MOS transistor region and phosphorus P⁻ ions are implanted into the P-channel MOS transistor region.

Figure 19A:
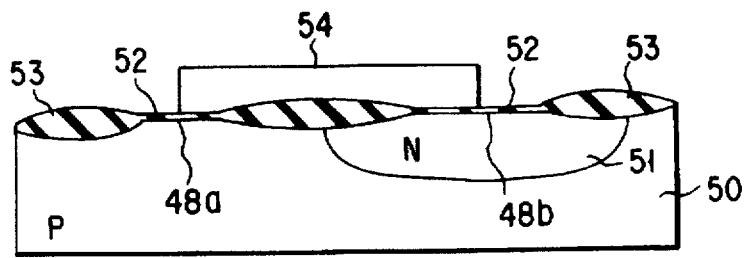
FIGS. 19A and 19B are cross sectional views for illustrating the manufacturing method of the CMOS inverter according to the seventh embodiment of the present invention.
Figure 19B:
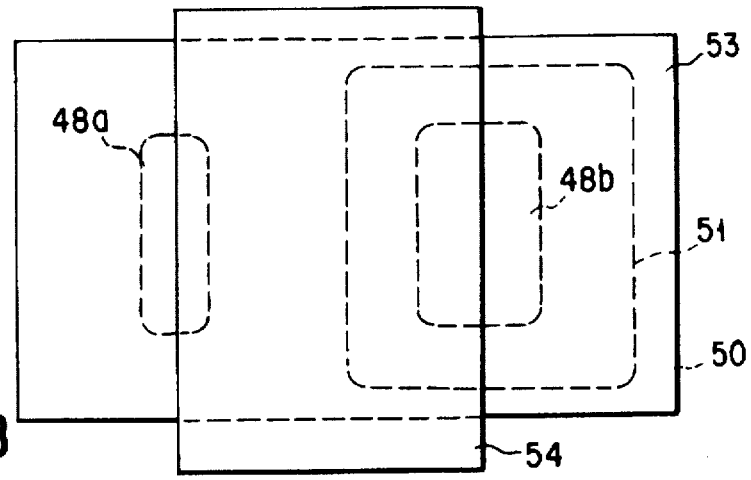

Next, boron B⁺ ions are implanted into the P- and N-channel MOS transistors as the second ion-implantation for adjusting the threshold value. In the second threshold value adjustment for the P- and N-channel MOS transistors, as shown in FIGS. 19A and 19B, parts of both types of the MOS transistors are masked with a resist 54 after the ion-implantation and then impurity diffusion is effected by use of a diffusion mask which is partly opened. As a result, different impurity concentrations can be attained in the region covered with the diffusion mask 54 and in the region which is not covered. Further, the second ion-implantation can be effected by use of a common mask 54 shown in FIGS. 19A and 19B. In this case, the impurity diffusion may be effected for part of the MOS transistor of one conductivity type as required. The impurity diffusion may be easily attained by use of the ion-implantation technique, but gas or solid may be used as the diffusion source. For example, in the ion-implantation, boron is implanted by 1.0 E12 with 30 keV. The impurity diffusion may be effected for MOS transistors of both types in the same step, but the threshold values of the respective regions can be independently set to optimum values by effecting the impurity diffusion in different steps.

Figure 20A:
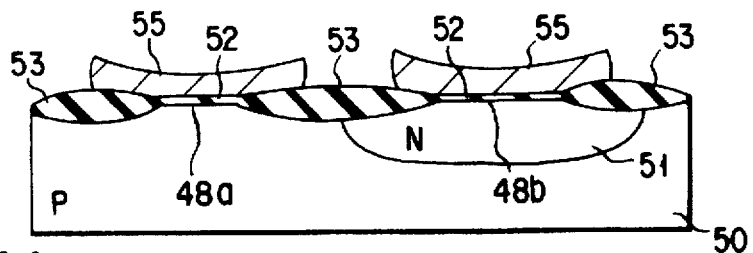
FIGS. 20A to 20D are cross sectional views for illustrating the manufacturing method of the CMOS inverter according to the seventh embodiment of the present invention.
Figure 20B:
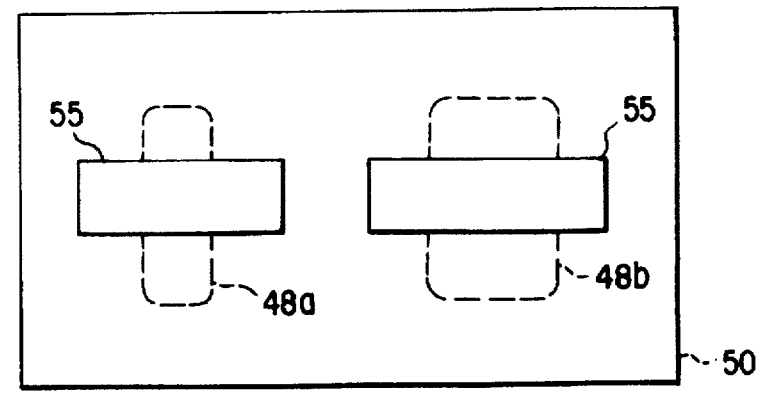
Figure 20C:
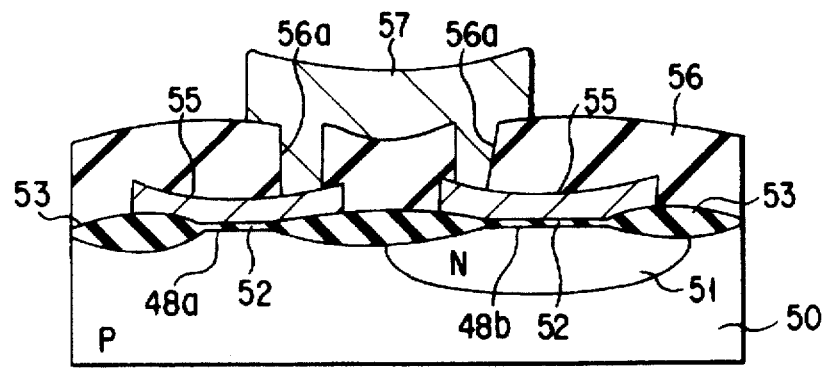
Figure 20D:
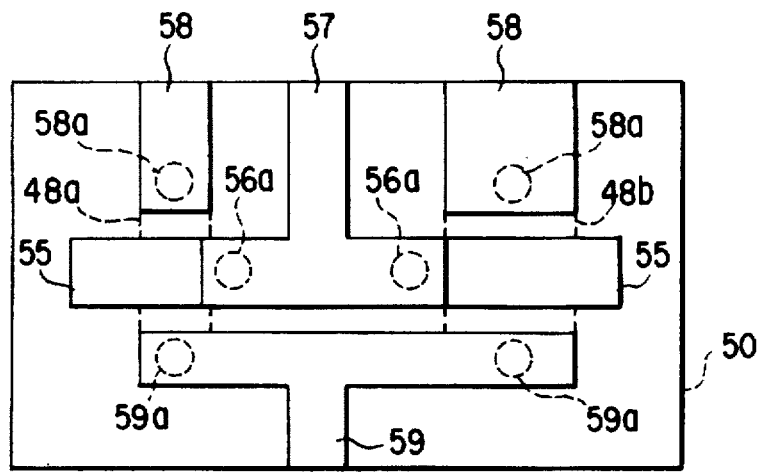

Next, as shown in FIGS. 20A and 20B, a gate electrode 55 is formed of polysilicon to a film thickness of 0.3 µm. Then, arsenic (As) ions as N⁺ ions are ion-implanted in the self-alignment manner by using the gate electrode 55 as a mask with an acceleration voltage of 100 keV at 5×10¹⁵/cm² to form N⁺ diffused regions (not shown) which are to be source/drain regions. Next, as shown in FIGS. 20C and 20D, an inter-level insulation film 56 is formed.

Then, a contact hole 56a for the gate electrode 55 and contact holes 58a, 59a for the source/drain regions are formed, and metal interconnection layers 57, 58, 59 are formed of aluminum Al.

Next, although not shown in the drawing, a protection film is formed and a lead-out interconnection region is formed.

According to the seventh embodiment, since the threshold values of the respective regions of the CMOS inverter can be made different by ion-implantation into the channel regions of the respective MOS transistors, the threshold value thereof can be very easily controlled in the manufacturing process.

(Embodiment 8)

Figure 21:
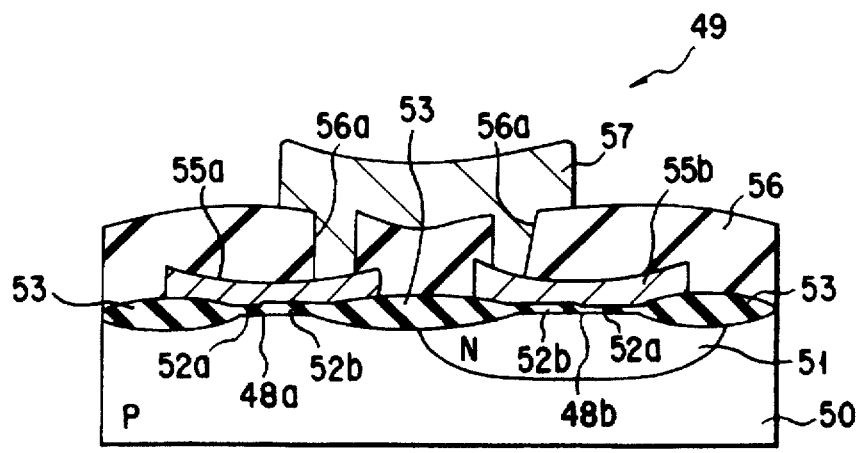
FIG. 21 is a cross sectional view showing the structure of a CMOS inverter according to an eighth embodiment of the present invention.

FIG. 21 is a cross sectional view showing the structure of a CMOS inverter according to an eighth embodiment of the present invention. The eighth embodiment is an example in which the threshold values of the respective regions are made different by forming a plurality of gate insulation films with different film thicknesses on the respective MOS transistors.

In the eighth embodiment, at least one pair of gate oxide films are adjacent to each other so as to set the threshold values of the P- and N-channel MOS transistors to different values. As shown in FIG. 21, the P-channel MOS transistor has an insulation film 52a and an insulation film 52b adjacent to and thicker than the gate insulation film 52a, and the N-channel MOS transistor has an insulation film 52a and an insulation film 52b adjacent to and thicker than the gate insulation film 52a.

According to the eighth embodiment, the threshold values of MOS transistors of the CMOS inverter is quite controllable in the manufacturing process.

(Embodiment 9)

FIGS. 22A to 22D, 23A to 23D and 24A to 24D are cross sectional views for illustrating the manufacturing method of a CMOS inverter according to a ninth embodiment of the present invention. The manufacturing method of the ninth embodiment is to make the threshold values of the respective regions of a plurality of regions of a CMOS inverter different by changing the thickness of gate insulation films of the respective MOS transistors.

First, as shown by the cross sectional view of FIG. 22A and the plan view of FIG. 22B, a P-type semiconductor substrate 50 to be used is initially oxidized. Then, an N-type well 51 is formed to the depth of 3 µm in the P-type semiconductor substrate 50. Next, as shown by the cross sectional view of FIG. 22C and the plan view of FIG. 22D, a field oxide film 53 with a film thickness of 0.7 µm is formed as an element isolation region by the ordinary LOCOS method, and subsequently a first gate insulation film 52 is formed. The first gate insulation film 52 is formed as a gate oxide film with a film thickness of 10 nm, for example. Then, ion-implantation is effected for threshold value adjustment. Boron $B^+$ ions are implanted into both of the P- and N-channel MOS transistor regions. As a result, the first threshold values of the P- and N-channel MOS transistor regions are adjusted. Further, the ion-implantation for preventing the punch through is effected. That is, boron $B^+$ ions are implanted into the N-channel MOS transistor region and phosphorus P ions are implanted into the P-channel MOS transistor region.

Figure 23A:
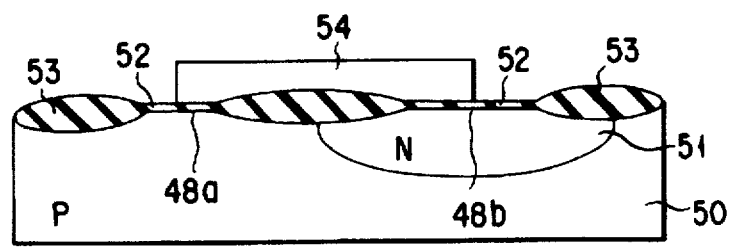
FIGS. 23A to 23D are cross sectional views for illustrating the manufacturing method of the CMOS inverter according to the ninth embodiment of the present invention.
Figure 23B:
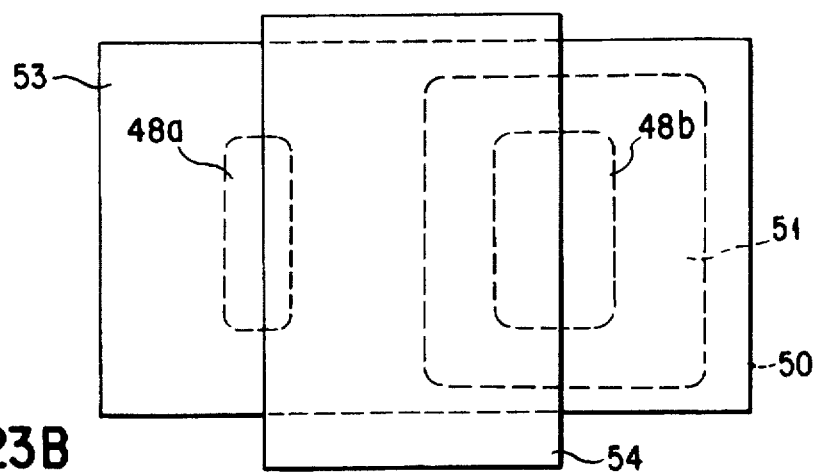
Figure 23C:
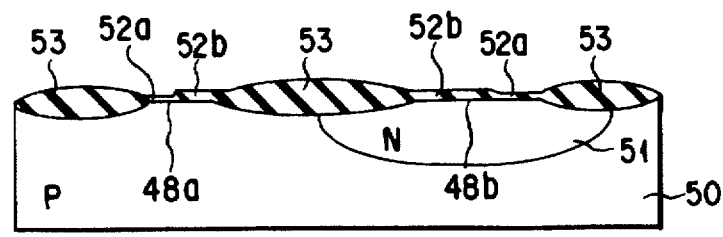
Figure 23D:
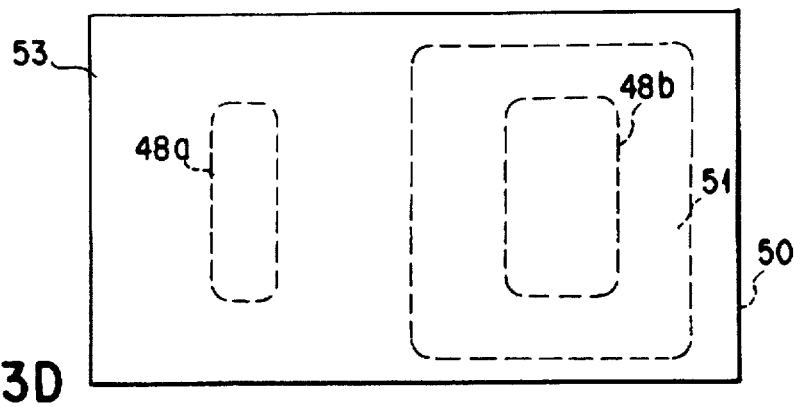

Next, as shown in FIGS. 23A and 23B, parts of the P- and N-channel MOS transistors are masked with a resist 54 and then unmasked part of the first gate oxide film 52 is removed. Masked part of the first gate oxide film is left behind as a gate oxide film 52b. For example, as shown in FIGS. 23A and 23B, a substantially half portion of the gate oxide film 52 is removed with the resist 54 used as a mask. Then, the resist 54 is removed and oxidation is effected again. As a result, as shown in FIGS. 23C and 23D, a second gate insulation film 52a with a film thickness of 10 nm is formed, for example. At this time, the second gate insulation film 52b is oxidized again and the film thickness thereof is increased to make a second gate oxide film 52b with a film thickness of 14 nm, for example. As a result, gate oxide film regions with two different film thicknesses, that is, the gate oxide film region 52a with the film thickness of 10 nm and the gate oxide film region 52b with the film thickness of 14 nm can be attained in both of the P- and N-channel MOS transistors. In this case, the P- and N-channel MOS transistors contained in the same CMOS inverter are constructed in such a manner that the transistors with different gate oxide film thicknesses are connected in parallel.

Figure 24A:
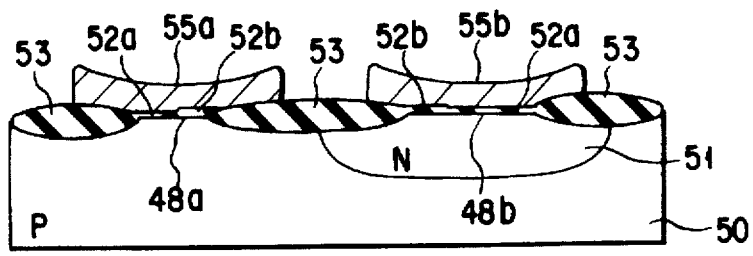
FIGS. 24A to 24D are cross sectional views for illustrating the manufacturing method of the CMOS inverter according to the ninth embodiment of the present invention.
Figure 24B:
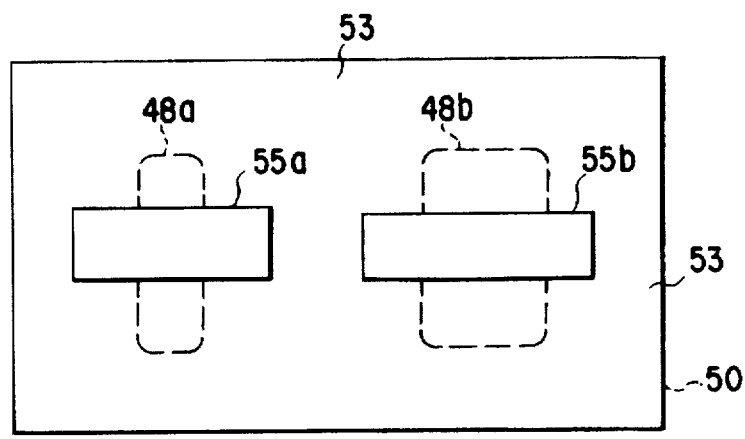
Figure 24C:
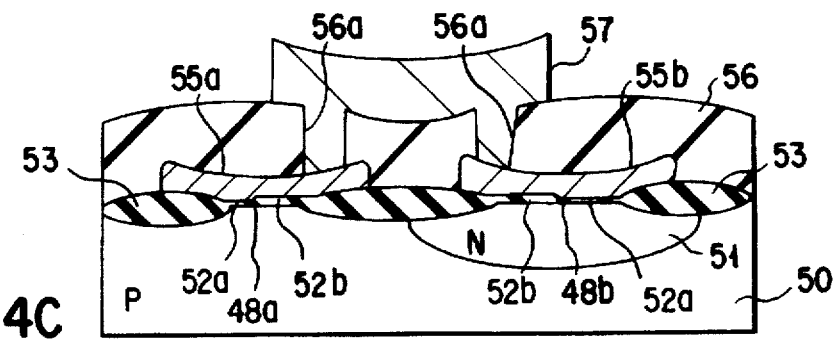
Figure 24D:
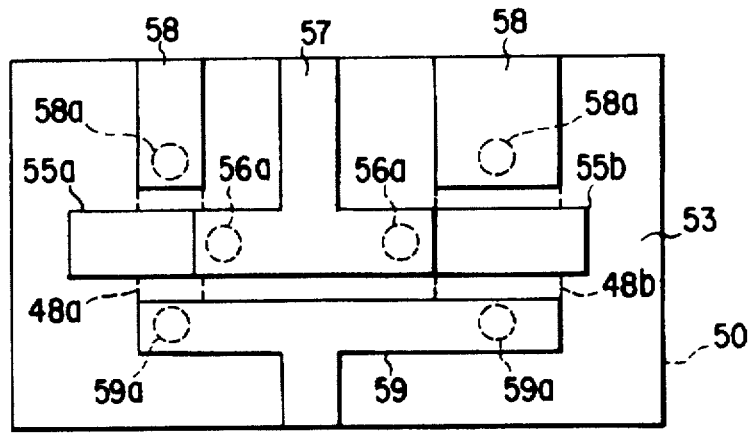

Next, as shown in FIGS. 24A and 24B, gate electrodes 55a, 55b are formed of polysilicon to a film thickness of 300 nm. Then, arsenic As ions which as $N^+$ ions are ion-implanted in the self-alignment manner by using the gate electrodes 55a, 55b as a mask with an acceleration voltage of 100 keV at $5 \times 10^{15}/cm^2$ so as to form $N^+$ diffused regions (not shown) which are to be source/drain regions. Next, as shown in FIGS. 24C and 24D, an inter-level insulation film 56 is formed. Then, contact holes 56a for the gate electrodes 55a, 55b and contact holes 58a, 59a for the source/drain regions are formed, and metal interconnection layers 57, 58, 59 are formed of aluminum Al. Next, although not shown in the drawing, a protection film is formed and then a lead-out interconnection region is formed.

According to the ninth embodiment, the threshold values of the MOS transistors can be very easily controlled in the manufacturing process.

(Embodiment 10)

Figure 25:
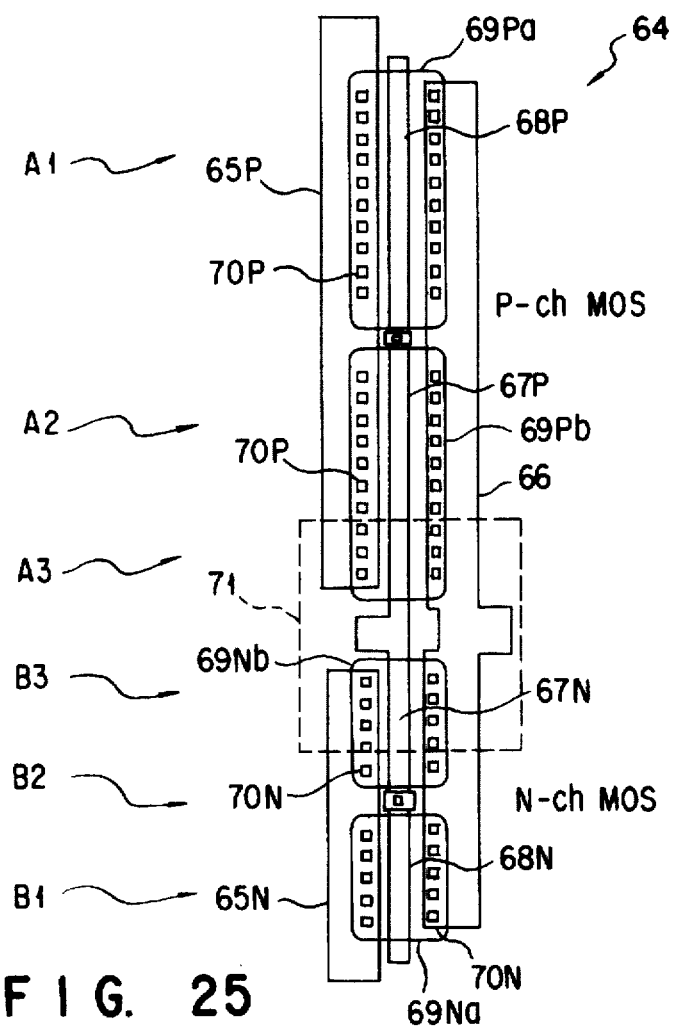
FIG. 25 is a plan view showing the structure of a CMOS inverter according to a tenth embodiment of the present invention.

FIG. 25 is a plan view showing the structure of a CMOS inverter according to a tenth embodiment of the present invention. The tenth embodiment is an example in which transistor regions of different threshold values are formed by changing the gate electrode materials. That is, the tenth embodiment is to form P-channel MOS transistors having threshold values which are made different by use of different gate electrode materials or N-channel MOS transistors having threshold values which are made different by use of different gate electrode materials.

A gate electrode portion using polysilicon 67P, 67N and a gate electrode portion using tungsten 68P, 68N are formed in the P- and N-channel MOS transistors. The gate electrode portions are electrically connected. Diffusion layers to be used as source/drain regions are separately formed for respective regions corresponding to the gate electrode portion using polysilicon 67P, 67N and the gate electrode portion using tungsten 68P, 68N in the P- and N-channel MOS transistors. That is, an N-type impurity diffused layer 69Pa in the tungsten gate electrode portion 68P and an N-type impurity diffused layer 69Pb in the polysilicon gate electrode portion 67P are separately formed in the P-channel MOS transistor, and a P-type impurity diffused layer 69Na in the tungsten gate electrode portion 68N and a P-type impurity diffused layer 69Nb in the polysilicon gate electrode portion 67N are separately formed in the N-channel MOS transistor.

In FIG. 25, reference numerals 65P, 65N, 66 denote common lead-out electrodes formed of Al or the like, and 70P, 70N denote contacts for connecting the impurity diffused layers to the lead-out electrodes. Also, in the tenth embodiment, ion-implantation can be effected to adjust the threshold values of the regions, as required. For example, ion-implantation can be effected for an ion-implanting region 71 of FIG. 25.

According to the tenth embodiment, since the threshold values can be changed by changing the gate electrode materials, the impurity concentration can be lowered, thereby making it possible to enhance the operation speed of the CMOS inverter. Further, due to the low impurity concentration, a CMOS inverter whose characteristic is stable can be attained.

(Embodiment 11)

Figure 26A:
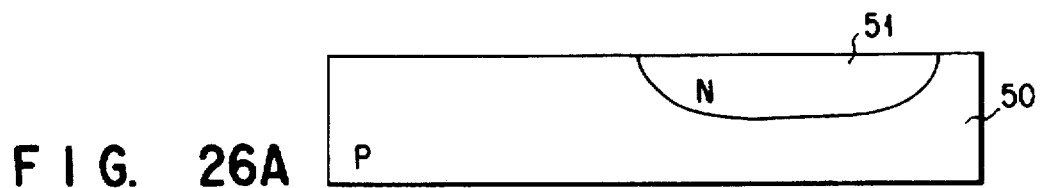
Figure 26B:
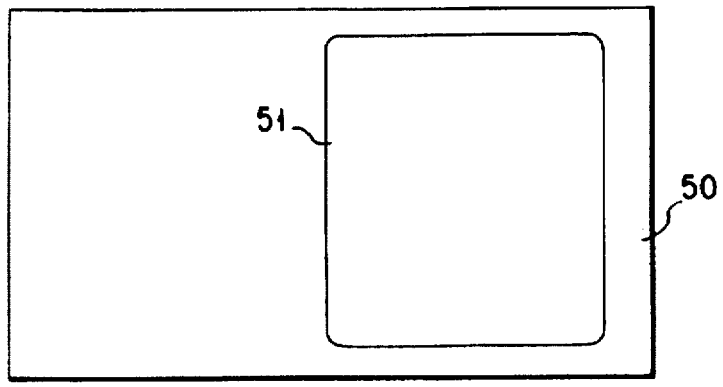
Figure 27C:
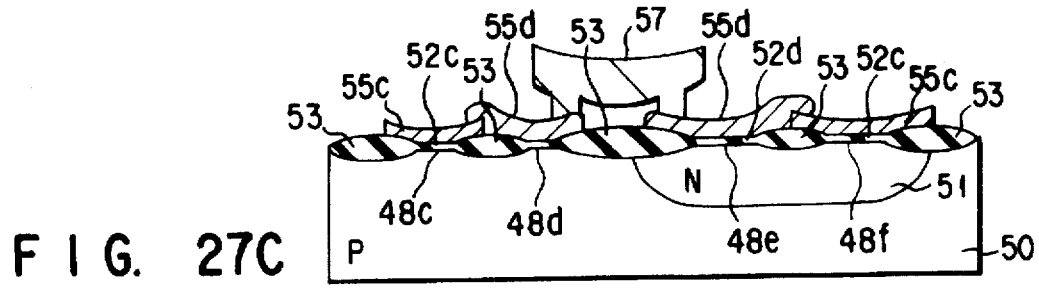
Figure 27D:
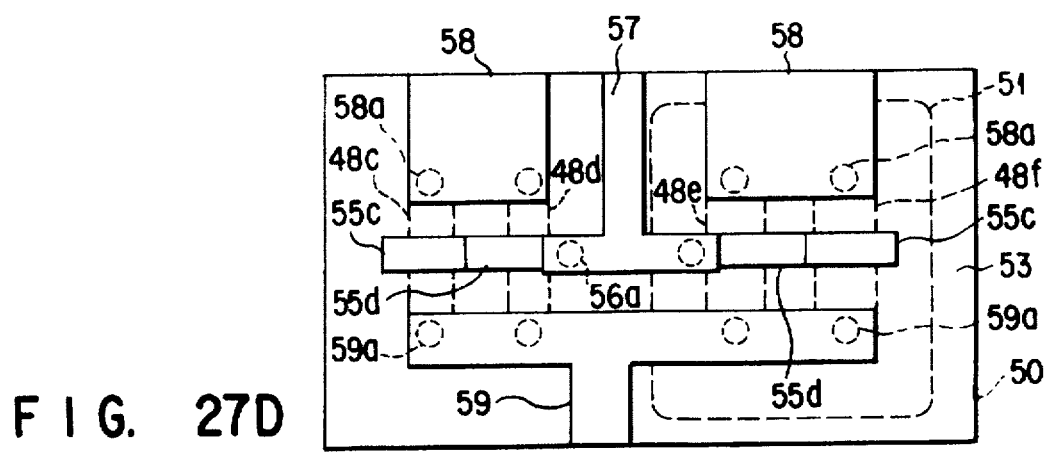

FIGS. 26A to 26D and 27A to 27D are cross sectional views for illustrating the manufacturing method of a CMOS inverter according to an eleventh embodiment of the present invention. The eleventh embodiment is a method of manufacturing a CMOS inverter by changing the gate materials. As shown in FIGS. 26A and 26B, a P-type semiconductor substrate 50 is used.

First, the P-type semiconductor substrate 50 is initially oxidized. Then, an N-type well 51 is formed to the depth of 3 μm in the P-type semiconductor substrate 50. Next, as shown in FIGS. 26C and 26D, a field oxide film 53 with a film thickness of 0.7 μm is formed as an element isolation region by the ordinary LOCOS method. Gate oxide films 52c, 52d with a film thickness of 10 nm are formed as gate insulation films in the element forming region enclosed by the field oxide film 53. Next, ion-implantation for threshold value adjustment is effected. For example, boron $B^+$ ions are implanted into the P- and N-channel MOS transistor regions. As a result, the first threshold values of the P- and N-channel MOS transistor regions are adjusted. Further, the ion-implantation for preventing the punch through is effected. For example, boron $B^+$ ions are implanted into the N-channel MOS transistor region and phosphorus P ions are implanted into the P-channel MOS transistor region.

Next, as shown in FIGS. 27A and 27B, first gate electrodes 55c are formed of polysilicon to a film thickness of 300 nm for both of the P- and N-channel MOS transistor regions and then second gate electrodes 55d are formed of tungsten to a film thickness of 150 nm. That is, the gate electrode for one of the two MOS transistor regions in the N- and P-channel MOS transistor regions is formed of polysilicon 55c, and the other gate electrode is formed of tungsten 55d. Then, arsenic As ions which are $N^+$ ions are ion-implanted in the self-alignment manner by using the gate electrodes 55c, 55d as a mask with an acceleration voltage of 100 keV at $5 \times 10^{15}/cm^2$ to form $N^+$ diffused regions (not shown) which are source/drain regions. Next, as shown in FIGS. 26C and 26D, an inter-level insulation film 56 is formed. Then, a contact hole 56a for the gate electrode 55d and contact holes 58a, 59a for the source/drain regions are formed, and metal interconnection layers 57, 58, 59 are formed of aluminum Al. Next, although not shown in the drawing, a protection film is formed and then a lead-out interconnection region is formed.

According to the eleventh embodiment, since the impurity concentration can be lowered, the operation speed of the CMOS inverter can be enhanced. Further, due to the low impurity concentration, a CMOS inverter whose characteristic is stable can be attained.

(Embodiment 12)

Figure 28:
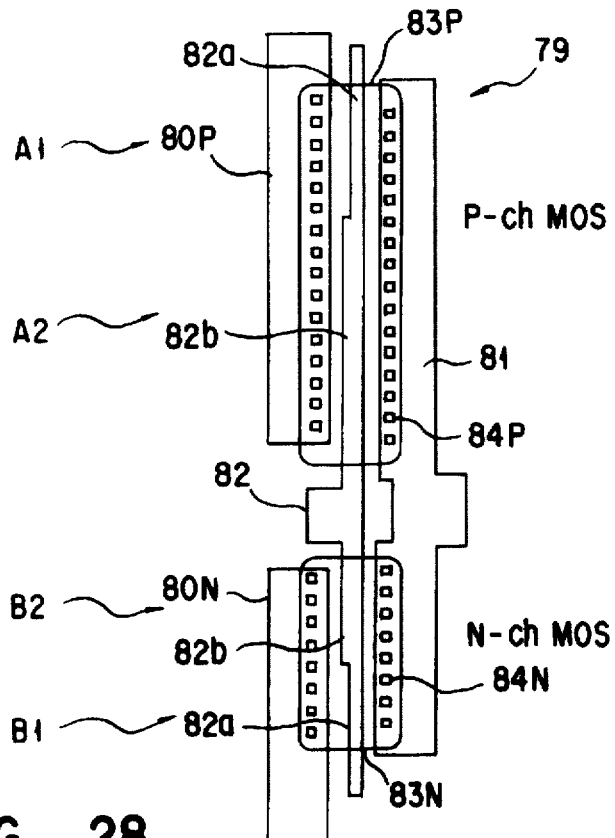
FIG. 28 is a plan view showing the structure of a CMOS inverter according to a twelfth embodiment of the present invention.

FIG. 28 is a plan view showing the structure of a CMOS inverter according to a twelfth embodiment of the present invention. The twelfth embodiment is based on the fact that the threshold value is changed by the short channel effect by partially changing the gate length.

P- or N-channel MOS transistors with different threshold values are formed by changing the channel lengths thereof. In FIG. 28, a common gate electrode 82 of the P- and N-channel MOS transistors comprises by a portion 82a having short gate length and a portion 82b having long gate length.

In FIG. 28, reference numerals 80P, 80N, 81 denote common lead-out electrodes formed of Al or the like, 83P denotes an N-type impurity diffused layer used as a common source/drain region of the P-channel MOS transistors, 83N denotes a P-type impurity diffused layer used as a common source/drain region of the N-channel MOS transistors, and 84P, 84N denote contacts for connecting the impurity diffused layers to the lead-out electrodes.

According to the twelfth embodiment, since the threshold values can be made different by partially changing the gate lengths and the manufacturing process can be made simple, the CMOS inverter can be formed at low cost. Further, due to the low impurity concentration, a CMOS inverter whose characteristic is most stable can be attained.

(Embodiment 13)

FIGS. 29A to 29D and 30A to 30D are cross sectional views for illustrating the manufacturing method of a CMOS inverter according to a thirteenth embodiment of the present invention. The thirteenth embodiment is a method of manufacturing a CMOS inverter by changing the channel lengths of MOS transistor regions.

Figure 29A:
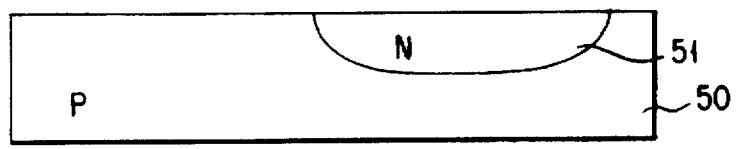
FIGS. 29A to 29D are cross sectional views for illustrating the manufacturing method of a CMOS inverter according to a thirteenth embodiment of the present invention.
Figure 29B:
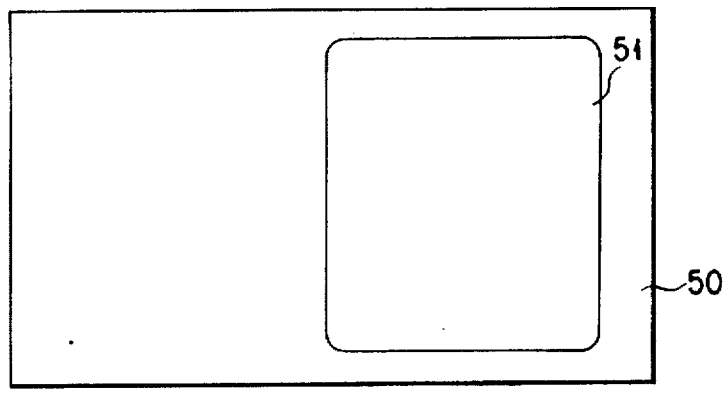
Figure 29C:
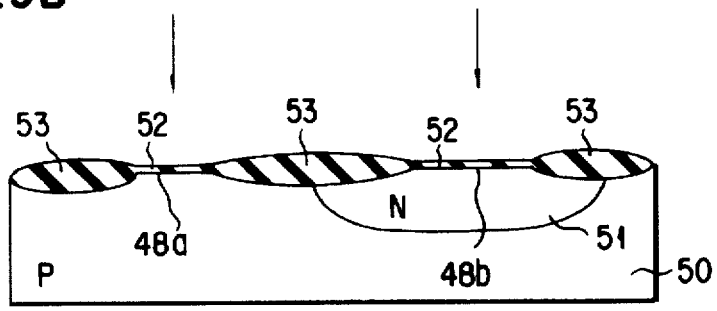
Figure 29D:
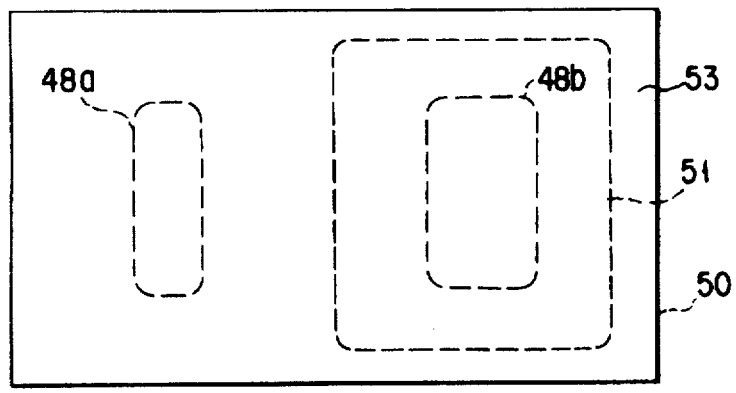

First, as shown in FIGS. 29A and 29B, after a P-type semiconductor substrate 50 is initially oxidized, an N-type well 51 is formed to the depth of 3 μm in the P-type semiconductor substrate 50. Next, as shown in FIGS. 29C and 29D, a field oxide film 53 with a film thickness of 0.7 μm is formed as an element isolation region by the ordinary LOCOS method. Next, a gate oxide film 52 with a film thickness of 10 nm is formed. Then, ion-implantation for threshold value adjustment is effected, and boron $B^+$ ions are implanted into the P- and N-channel MOS transistor regions. As a result, the threshold values of the P- and N-channel MOS transistors are adjusted. Further, the ion-implantation for preventing the punch through is effected. For example, boron $B^+$ ions are implanted into the N-channel MOS transistor region and phosphorus $P^-$ ions are implanted into the P-channel MOS transistor region.

Figure 30A:
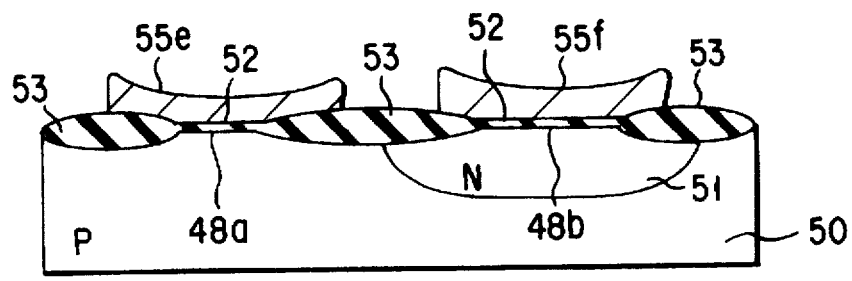
Figure 30B:
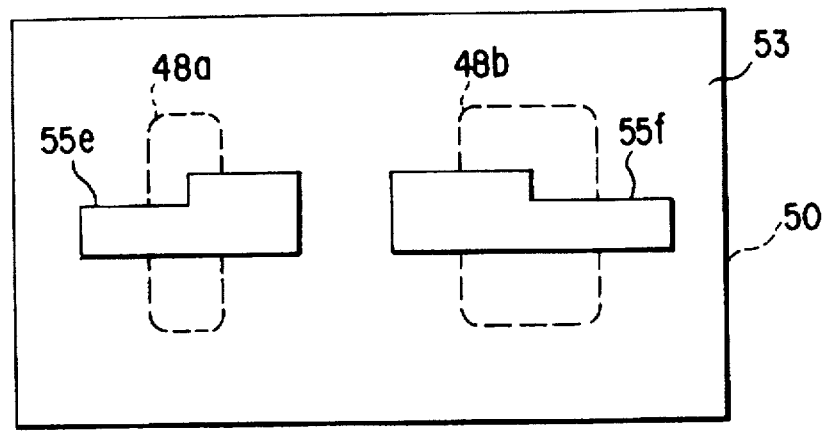
Figure 30C:
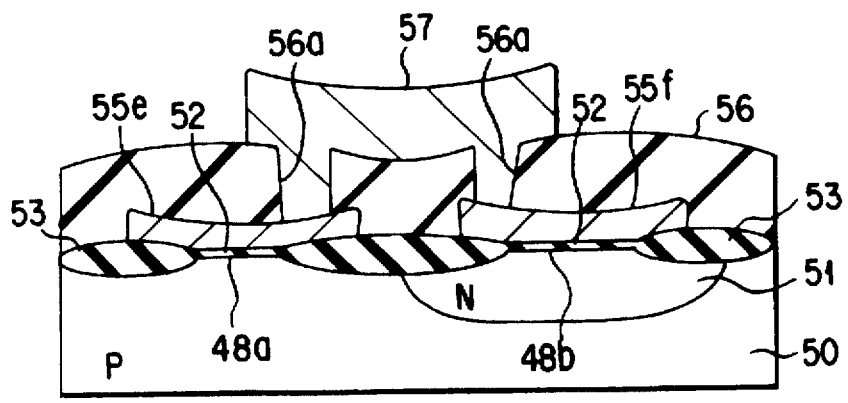

Then, as shown in FIGS. 30A and 30B, gate electrodes 55e, 55f are formed of a polysilicon film with a film thickness of 300 nm. In this case, as shown in FIG. 30B, the gate electrodes 55e, 55f are formed by patterning the polysilicon film in such a manner that the gate length covering substantially the half portion of the channel width becomes shorter than the remaining half portion. Next, as described before, source/drain regions are formed. Then, as shown in FIGS. 30C and 30D, an inter-level insulation film 56 is formed and contact holes 56a, 58a, 59a are formed in the same manner as described before. Further, metal interconnection layers 57, 58, 59 are formed. Then, although not shown in the drawing, a protection film is formed and then a lead-out interconnection region is formed.

According to the thirteenth embodiment, the CMOS inverter can be formed at very low cost.

In the seventh, ninth, eleventh and thirteenth embodiments, the CMOS inverter manufacturing methods are independently explained, but in the present invention, it is clearly understood by those skilled in the art that a desired CMOS inverter can be formed by adequately combining the above manufacturing methods as required. For example, the ninth embodiment of FIG. 25 shows the manufacturing method using combination of ion-implantation into the channel and the manufacturing method for constructing the CMOS inverter by changing the gate electrode materials.

(Embodiment 14)

Figure 1:
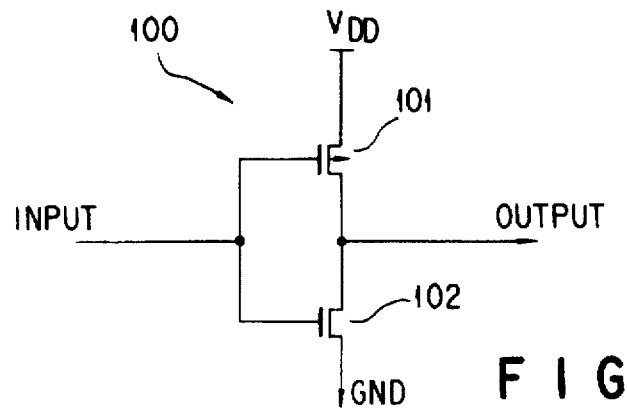
FIG. 1 is a circuit diagram showing the construction of the conventional CMOS inverter.
Figure 3:
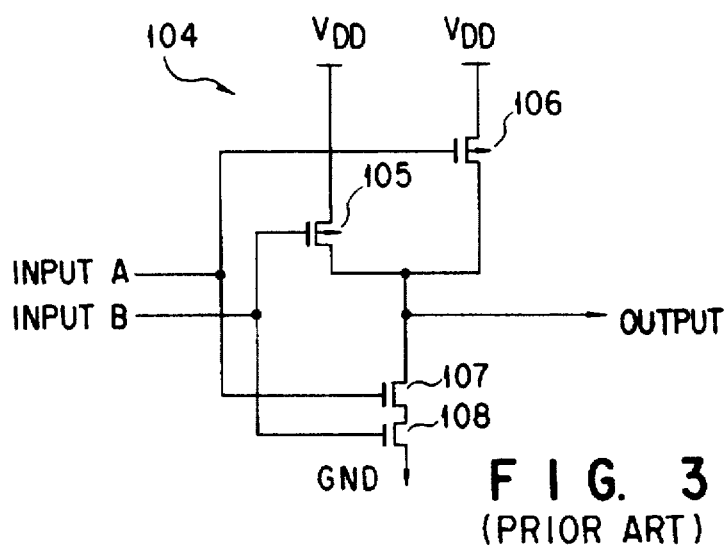
FIG. 3 is a circuit diagram showing the construction of the conventional NAND circuit.
Figure 4:
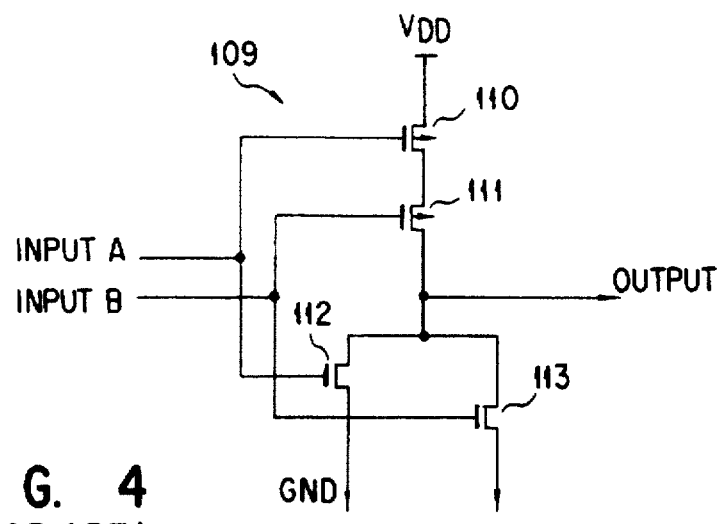
FIG. 4 is a circuit diagram showing the construction of the conventional NOR circuit.

FIG. 31 is a circuit diagram showing the construction of a NAND circuit according to a fourteenth embodiment of the present invention. As the fourteenth embodiment, an example of a 2-input NAND circuit with the simplest construction is shown, but the present invention can also be applied to a multi-input NAND circuit. The 2-input NAND circuit comprises parallel-connected P-type MOS transistors 10 of the present invention shown in FIG. 1 and series-connected N-type MOS transistors 20. In the 2-input NAND circuit, a through current flowing between the reference power supply terminals can be reduced by the P-type MOS transistors 10 of the present invention, but the operation speed of the circuit can be maintained.

According to the fourteenth embodiment, like the CMOS inverter, it can cope with the load current and the through current can be reduced while maintaining the high response speed.

(Embodiment 15)

FIG. 32 is a circuit diagram showing the construction of a NOR circuit according to a fifteenth embodiment of the present invention. As the fifteenth embodiment, an example of a 2-input NOR circuit with the simplest construction is shown, but the present invention can also be applied to a multi-input NOR circuit. The 2-input NOR circuit comprises parallel-connected N-type MOS transistors 15 of the present invention shown in FIGS. 7A and 7B and series-connected P-type MOS transistors 21. Also, in the 2-input NOR circuit, a through current flowing between the reference power supply terminals can be reduced by the N-type MOS transistors 15 of the present invention, but the operation speed of the circuit can be maintained.

According to the fifteenth embodiment, it can cope with the load current and the through current can be reduced while maintaining the high response speed.

A description will now be given of the results of a SPICE simulation which was performed so as to confirm the power consumption reduction effect of the present invention. In the simulation, a variation in the power consumption by a CMOS inverter was examined in relation to a change in the threshold of the parallel connection region of MOS transistors.

The CMOS inverter used in the simulation had such a circuit configuration as shown in FIG. 33, and the thresholds used are shown in Table 1 below. The gate oxide film had a thickness of 100 angstroms, and the channel region had a size (L/W) of 1.0/1.0 μm.

TABLE 1

|   | 0 | 1 | 2 | 3 |
|---|---|---|---|---|
| $P_1$ | −0.5 | −0.5 | −0.5 | −0.5 |
| $P_2$ | −0.5 | −1.0 | −0.5 | −1.0 |
| $N_1$ | 0.5 | 0.5 | 0.5 | 0.5 |
| $N_2$ | 0.5 | 0.5 | 1.0 | 1.0 |

In Table 1, "0" represents a case where the absolute values of the thresholds of $P_1$, $P_2$, $N_1$, and $N_2$ are equal, "1" represents a case where the thresholds of $P_1$ and $P_2$ differ from each other, "2" represents a case where the thresholds of $N_1$ and $N_2$ differ from each other, and "3" represents the case where the thresholds of $P_1$ and $P_2$ differ from each other and those of $N_1$ and $N_2$ differ from each other. As shown in FIG. 34, the power consumption was low in cases "1", "2" and "3" in comparison with case "0". In case "3" in particular, the mathematical product of (gate voltage)×(drain current) was 0.75 where the corresponding mathematical product of case "0" was 1. It was therefore confirmed that the power consumption could be reduced by 25% in case "3".

Although not specifically explained, it should be noted that the CMOS inverter manufacturing methods explained in the seventh, ninth, eleventh and thirteenth embodiments can also be applied as the manufacturing method of the NAND circuit of the fourteenth embodiment and the NOR circuit in the fifteenth embodiment.

As described above, according to the present invention, regions having different threshold values can be formed in a single MOS transistor, and when a MOS transistor formed on the semiconductor substrate is used at normal temperatures, a non-linear characteristic having at least one inflection point in the rise or fall region of the operating region in the conductive state can be realized. Further, according to the present invention, a CMOS inverter (NOT circuit), NAND circuit and NOR circuit which can cope with the load current and reduce the through current while maintaining the high response speed can be realized.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A CMOS inverter comprising:

a plurality of MOS transistors of first and second conductivity types series-connected between reference power supply terminals, for receiving an input signal at the gate of each of said MOS transistors and outputting an inverted signal from a connection node of the series connection;

wherein at least one of said MOS transistors of the first conductivity type and the second conductivity type comprises at least two adjacent discrete channel regions of one conductivity type, a common source and a common drain of an opposite conductivity type formed with the discrete channel region of the one conductivity type disposed therebetween, a gate insulation film having at least two adjacent regions having different threshold values and formed of a gate insulation material with partially different thicknesses formed on the discrete channel region of the one conductivity type, and a common gate formed on the gate insulation film.

2. A CMOS inverter comprising:

a plurality of MOS transistors of first and second conductivity types series-connected between reference power supply terminals, for receiving an input signal at the gate of each of said MOS transistors and outputting an inverted signal from a connection mode of the series connection;

wherein at least one of said MOS transistors of the first and second conductivity types comprises two adjacent discrete channel regions of one conductivity type, a common source and a common drain of an opposite conductivity type formed with the discrete channel region of the one conductivity type disposed therebetween, and a common gate formed above the discrete channel region of the one conductivity type and having at least two adjacent regions formed to have different threshold values by use of a gate electrode material formed of partially different materials.

* * * * *